(12) United States Patent
Fleurial et al.

(10) Patent No.: US 6,787,691 B2
(45) Date of Patent: Sep. 7, 2004

(54) MICROFABRICATED THERMOELECTRIC POWER-GENERATION DEVICES

(75) Inventors: Jean-Pierre Fleurial, Duarte, CA (US); Margaret A. Ryan, Pasadena, CA (US); Alex Borshchevsky, Santa Monica, CA (US); Wayne Phillips, Sunland, CA (US); Elizabeth A. Kolawa, Bradbury, CA (US); G. Jeffrey Snyder, Altadena, CA (US); Thierry Caillat, Pasadena, CA (US); Thorsten Kascich, Köln (DE); Peter Mueller, Baar (CH)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/146,707

(22) Filed: May 14, 2002

(65) Prior Publication Data

US 2003/0041892 A1 Mar. 6, 2003

Related U.S. Application Data

(63) Continuation of application No. 60/198,069, filed on Nov. 23, 1998, now Pat. No. 6,388,185.
(60) Provisional application No. 60/095,829, filed on Aug. 7, 1998, and provisional application No. 60/096,657, filed on Aug. 13, 1998.

(51) Int. Cl.$^7$ .......................... H01L 35/28; H01L 35/30; H01L 35/12
(52) U.S. Cl. ...................... 136/203; 136/205; 136/236.1
(58) Field of Search ............................... 136/203, 205, 136/236.1

(56) References Cited

U.S. PATENT DOCUMENTS 4,909,857 A    3/1990   Ondris et al. ............... 136/260
5,362,983 A   11/1994   Yamamura et al. ......... 257/414
5,517,468 A  * 5/1996   Inoue et al. ................. 368/64
5,712,448 A  * 1/1998   Vandersande et al. ...... 136/203
6,288,321 B1 * 9/2001   Fleurial et al. ............. 136/205
6,388,185 B1 * 5/2002   Fleurial et al. ............. 136/205

OTHER PUBLICATIONS

T Kacsich, et al., "Films of Ni–7 at% V, Pd, Pt and Ta–Si–N as diffusion barriers for copper on Bi2Te3"; Apr. 7, 1998; J. Phys. D: Appl. Phys. 31 (1998) 2406–2411.

J. P. Fleurial, et al., "Thermoelectric Microcoolers for Thermal Management Applications"; Proceedings of the XVI International Conference on Thermoelectrics; Dresden, Germany; Aug. 26–29, 1997.

* cited by examiner

Primary Examiner—Patrick Ryan
Assistant Examiner—Thomas H. Parsons
(74) Attorney, Agent, or Firm—Fish & Richardson P.C.

(57) ABSTRACT

A device for generating power to run an electronic component. The device includes a heat-conducting substrate (composed, e.g., of diamond or another high thermal conductivity material) disposed in thermal contact with a high temperature region. During operation, heat flows from the high temperature region into the heat-conducting substrate, from which the heat flows into the electrical power generator. A thermoelectric material (e.g., a BiTe alloy-based film or other thermoelectric material) is placed in thermal contact with the heat-conducting substrate. A low temperature region is located on the side of the thermoelectric material opposite that of the high temperature region. The thermal gradient generates electrical power and drives an electrical component.

5 Claims, 26 Drawing Sheets

MICROFABRICATED THERMOELECTRIC POWER-GENERATION DEVICES

CROSS REFERENCE TO RELATED APPLICATIONS

This application is a continuation (and claims the benefit of priority under 35 USC 120) of U.S. application Ser. No. 09/198,069 now U.S. Pat. No. 6,388,185, filed Nov. 23, 1998, which claims priority from U.S. provisional application serial No. 60/095,829, filed Aug. 7, 1998, and serial No. 60/096,657, filed Aug. 13, 1998. The disclosure of the prior applications is considered part of (and is incorporated by reference in) the disclosure of this application.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

FIELD OF THE INVENTION

This invention relates to devices employing a micro-sized thermoelectric power generating device.

BACKGROUND

Small electronic devices, such as those using integrated circuits, continue to play a major role in all aspects of society. Batteries have traditionally been used to power such devices.

The energy in a battery dissipates over time, requiring battery replacement or recharging.

Portable devices can be powered using thermoelectric ("TE") effects. The thermoelectric material generates power based on a thermal gradient. The thermal gradient for a wristwatch may be created by one side of the watch being exposed to the air (the cool side) and the other side being exposed to the wearer's wrist (the hot side). Preferably, the device is in direct contact with the hot region. Alternatively, the device may be in contact with a thermally-conducting material which, in turn, is in direct contact with the hot region. Heat rejection from the cold side of the thermoelectric device could be to the ambient air or to any other suitably cooler medium.

The thermoelectric material may be placed in thermal contact with the first substrate. Here, "thermal contact" and "thermally attached" can encompass any connection where heat easily flows from one material to another. This does not necessarily require that the materials be in direct contact. A metallization layer (described below) may be disposed between the substrate and the thermoelectric material to ensure that these materials are in thermal contact and mechanically attached.

In power-generation devices, a "natural" temperature gradient may be used to generate power through the Seebeck effect. In these devices, the thermoelectric materials may be sandwiched between a pair of thermally conducting electrically insulating substrates.

Diamond has the highest thermal conductivity (about 2400 $Wm^{-1}K^{-1}$) of any known material. Diamond also has an extremely high degree of hardness, and is an excellent electrical insulator.

SUMMARY

The present system describes a new kind of thermoelectric device that has advantages. Novel techniques of forming the system are also described.

An important advantage includes the ability to form a large number of thermoelectric legs due to the improved formation process.

A thermoelectric material, such as a BiTe alloy including $Bi_2Te_3$ and $Bi_2Te_3$-based alloys (in bulk or film form), may be used as the thermoelectric component. The thermoelectric material may be disposed between a first and second substrate. This material is patterned as a series of alternating $\mu$m-sized n-type and p-type regions, or "legs", on the substrates using microfabrication techniques. The area of the substrates may be larger than the area of the p and n leg region. The legs are preferably arranged in a two-dimensional "checkerboard" pattern, and at least some are electrically in series so that the output voltage is the sum of the individual voltages. The devices are thermally in parallel. Of course, the voltage potential can be controlled by connecting some of the legs in parallel as well.

The thermoelectric material is preferably microfabricated according to techniques described herein.

The disclosed microfabrication techniques allow forming thousands of legs, e.g., 1000–20,000 legs. They also offer the potential to achieve an appropriate voltage/current combination for a given temperature differential across a device.

Films of BiTe alloys deposited as legs on the substrate typically have thicknesses of between 5–100 $\mu$m. FIG. 2 shows the power output of a device as a function of leg thickness. The power output increases for a given cross-sectional area as the thermoelectric legs become thinner for a given temperature difference. This results in a higher output power density. Thin films of the thermoelectric material are therefore better if the thermal resistances or electrical contact resistances are low or negligible. Thin films also allow fabrication by IC fabrication technology.

Electrically insulating materials having high-thermal conductivities, such as silicon carbide, aluminum nitride, boron nitride, or beryllium oxide, may be used in place of the diamond substrates. Other materials with similar electrically insulating and thermally conducting properties (i.e., as close to diamond as possible) could also be used. The desirable properties of diamond and materials having similar properties enhance the effectiveness of the device. During operation, input heat from the hot side is rapidly and evenly spread out so that the substrate efficiently supplies heat to all the n and p legs.

A multi-layer stack structure is preferably used to attach the thermoelectric material to the substrate. The stack structure preferably has electrically and thermally conductive materials. Electrically conductive materials provide a series electrical connection between the p- and n-doped legs of the thermoelectric material. A low electrical contact resistance between the electrically conductive materials and the thermoelectric legs is desirable. This reduces the total internal electrical resistance of the device and reduces performance degradation.

Thermally-conductive materials within the stack structure facilitate heat flow between the thermoelectric material and the substrate. A low thermal resistance between the heat-dissipating device and the thermoelectric material reduces heat losses. These combined factors prevent a degradation in the performance of the device. A lower stack structure having a similar multi-layer configuration (and similar electrical and thermal properties) connects the thermoelectric material to the second heat-conducting substrate.

A preferred multi-layer stack structure includes a metallization layer coated on the inner surface of the substrate. This thin metal coating facilitates adhesion of the substrate to other materials. In preferred embodiments, metals such as titanium or chromium are used as the substrate metallization layers. An outer diffusion barrier layer, preferably composed of ternary alloys of metal-Si—N, where the metal is a transition metal such as Ti or Ta, may then be deposited on the metallization layer.

The outer diffusion barrier layer prevents the diffusion of copper to the metallization layer and to the substrate. Depending on temperature, the outer diffusion barrier may not be required. For example, at room temperature, the outer diffusion barrier may not be needed to prevent more inter-diffusion.

A copper layer is deposited on the outer diffusion barrier layer. An inner diffusion barrier layer, preferably composed of Pt or metal-Si—N, is then deposited on the copper layer. The inner diffusion barrier layer impedes the diffusion of copper (which has a high solid-state solubility and thus diffuses rapidly) into either the metallization layers or the thermoelectric material. Impeding the diffusion of copper prevents contamination of the other materials in the stack structure. An electrical contact layer, preferably including one of the transition metals, may be deposited if required on the inner diffusion barrier layer to complete the multi-layer upper stack structure.

P- and n-doped thermoelectric legs of the desired thickness are deposited on the electrical contact layer. A second electrical contact layer, followed by a second inner diffusion barrier layer, is deposited on the legs.

Each layer of the stack structures is preferably deposited using semiconductor device fabrication techniques.

Prior processes attempted to produce sharp, patterned thick photoresist structures using microelectrical mechanical system ("MEMS") technology, which is often based on x-ray lithography.

The major factors which limit the power output of the device include: 1) the temperature differential across the thermoelectric legs, which is a function of the series electrical resistance of the thermoelectric legs; 2) the electrical contact resistance provided by the upper and lower multi-layer connecting structures; 3) the geometry and number of legs; and 4) the thermal resistances for heat transfer at the hot and cold surfaces of the legs.

An increase in the available temperature differential will increase the available energy.

The contact resistances are particularly important with respect to thermoelectric legs of short lengths. For example, the conversion efficiency of a real system is about 20% lower than the value calculated in FIG. 3 for the thermoelectric materials only. This figure shows dimensionless figure of merit which represents the performance of a thermoelectric device which depends solely upon the properties of the thermoelectric material and the hot side and cold side temperatures. ZT is proportional to the square of the Seebeck coefficient divided by the product of the electrical resistivity and the thermal conductivity. The best ZT values are obtained in heavily doped semiconductors, such as BiTe alloys, PbTe alloys and Si—Ge alloys. The electrical contact resistance arises from the connection of all the legs in series. Typical values obtained for actual generators and coolers are 10 to 25 $\mu\Omega/cm^2$. The thermal contact resistance is generated by the heat transfer characteristics of the ceramic plates and contact layers used to build the thermoelectric module. The heat exchangers and corresponding heat losses should also be taken into account.

In addition, the transport properties of the thermoelectric materials vary with temperature, as illustrated in FIG. 1. When a thermoelectric device is operating across a wide temperature range, these variations may be factored in the calculation of its performance.

The smaller size coupled with integrated circuit technology allows the devices to handle higher power densities for both cooling and generator applications. In addition, thermoelectric device miniaturization enables its operation as a power generator at much higher voltages than is possible for bulk devices, due to the much larger number of thermoelectric elements (which may be two orders of magnitude larger). These higher voltages (1–100 V) are more compatible with other electronic components.

While the embodiment discloses a specific use, the teachings given herein may advantageously be used in many varieties of power generation devices. The invention may advantageously employ recovery of any kind of heat, e.g., waste heat.

BRIEF DESCRIPTION OF THE DRAWINGS

These and other aspects of the invention will now be described with reference to the attached drawings, in which.

DETAILED DESCRIPTION

The preferred power-generation features a thermoelectric material in the form of a 5–100 μm thick film, operating in combination with a high-thermal conductivity, high-electrical resistivity material, preferably diamond. The system uses a thermal gradient to generate its useful power.

Figure 1:
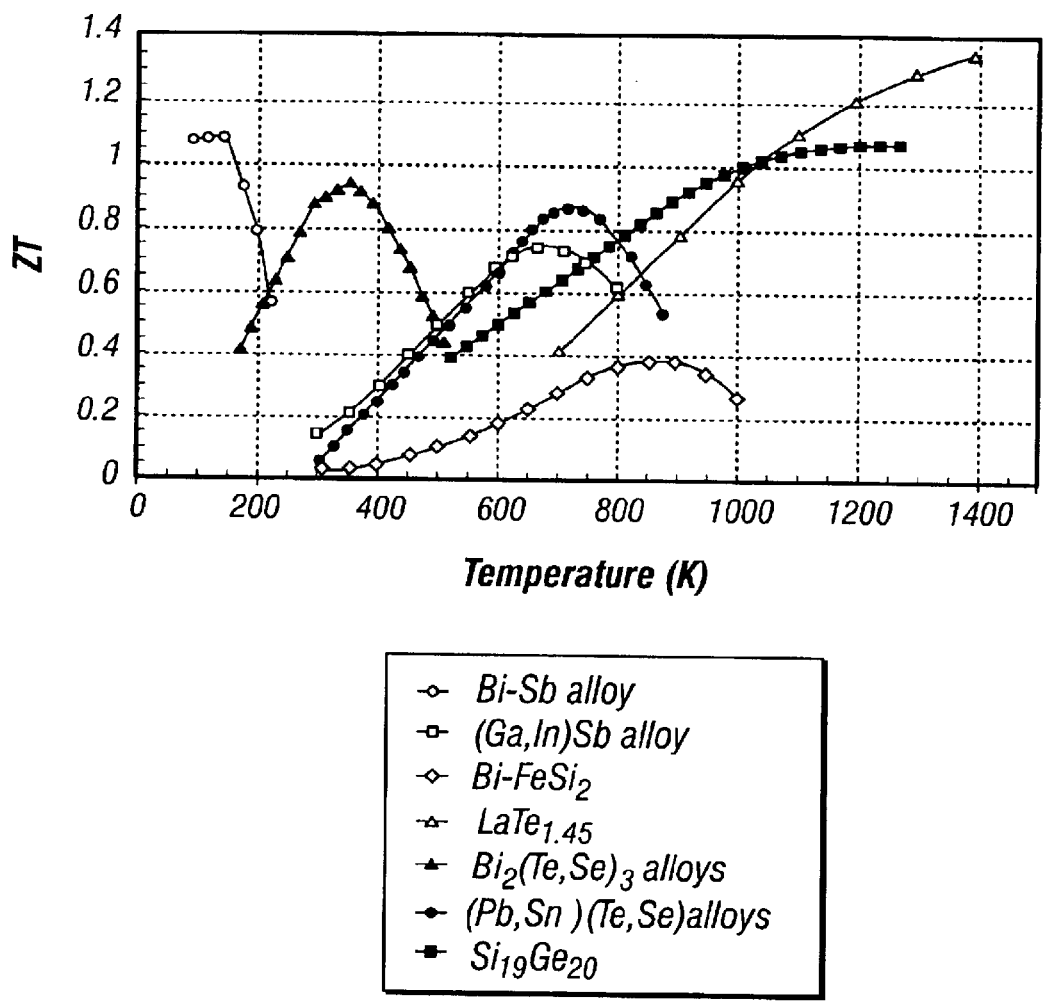
FIG. 1 shows a relationship between the figure of merit and temperature for various alloys.
Figure 4:
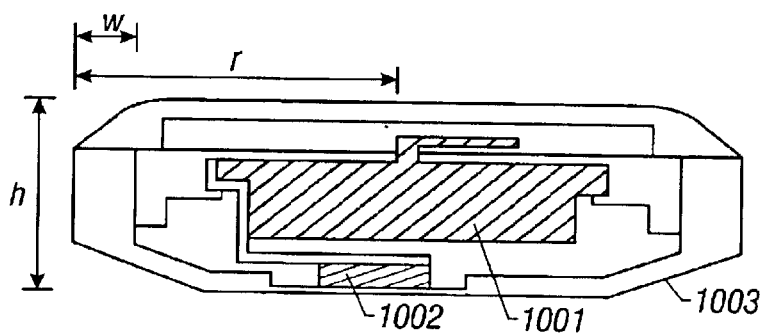
FIG. 4 shows a prior art diagram illustrating using a thermoelectric material in a wristwatch.

A preferred configuration shown in FIG. 4 is a cross-section of a wristwatch. A first substrate has a surface which is placed in thermal contact with a "hot" region 1003. During operation, heat flows away from the hot region and into the substrate. The heat is then incident from the substrate on a first surface of the thermoelectric device 1002. A second surface of the thermoelectric material is kept cooler in operation than the first surface. This results in a voltage potential being created across points of the thermoelectric device.

For example, when used in a wristwatch application as in FIG. 4, the first substrate surface may be a skin-abutting surface and may be placed in contact with a user's wrist. The second substrate surface would be exposed to the ambient air. The power from the device powers the timekeeper 1001.

Figure 5:
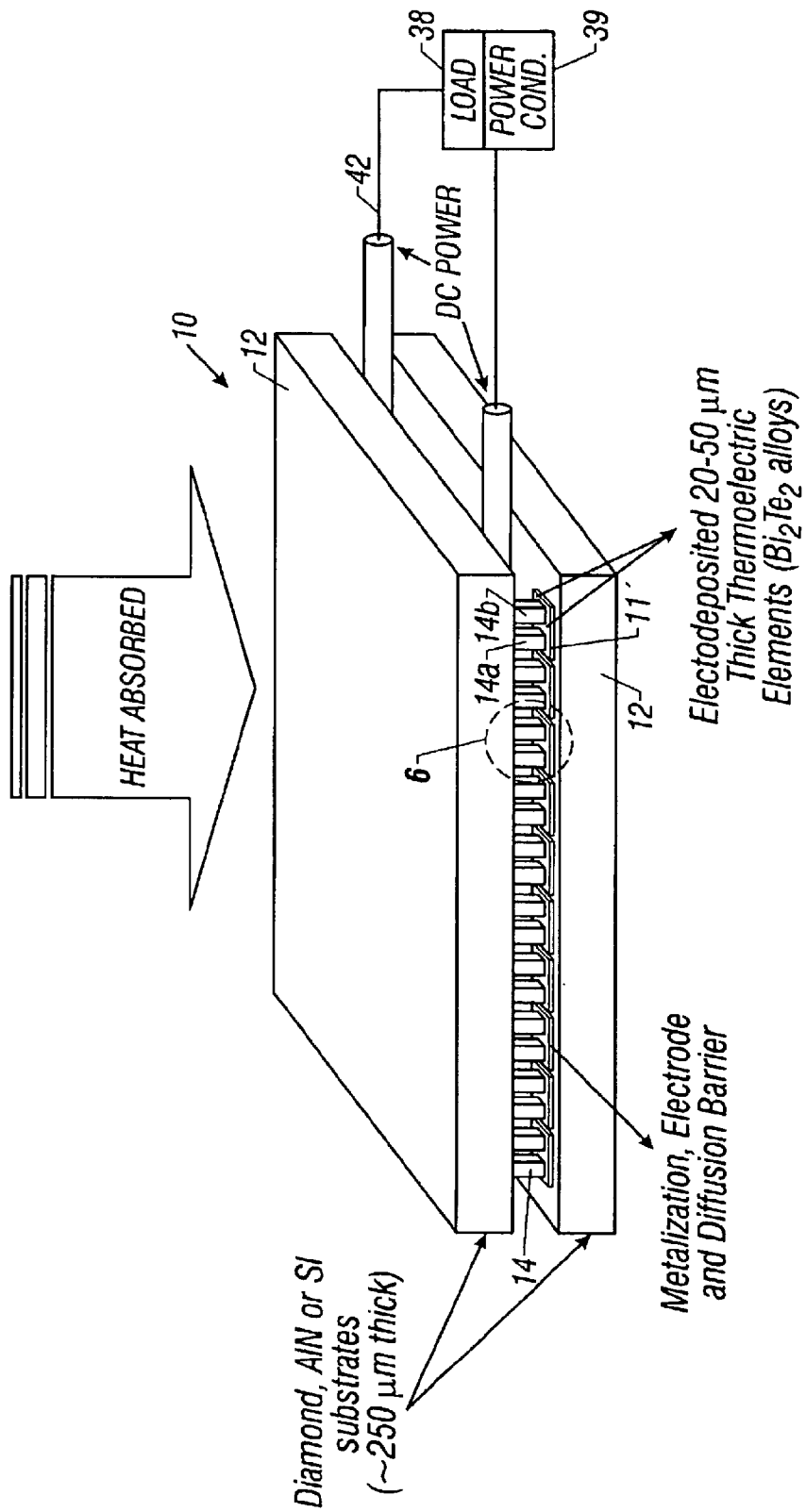
FIG. 5 shows a perspective view of the assembled preferred microcooler of the preferred embodiment.
Figure 6:
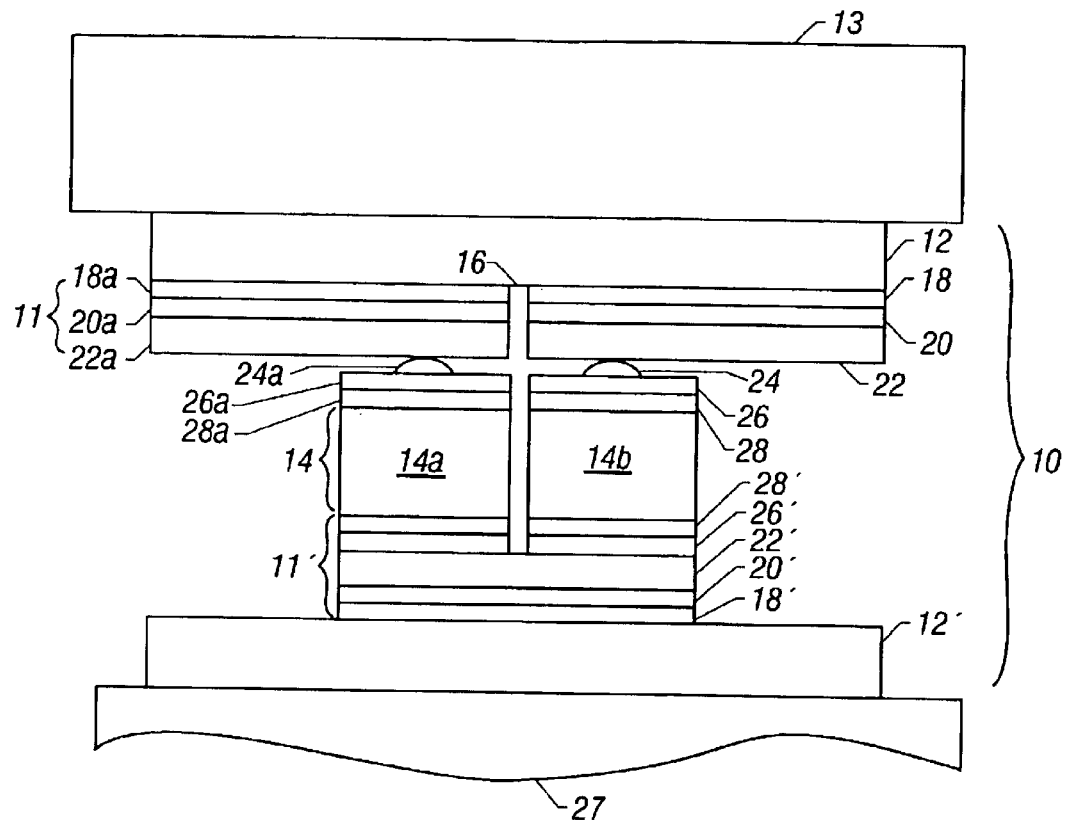
FIG. 6 shows a cross-sectional view of this preferred microcooler.

FIGS. 5 and 6 show different views of the device. The device 10 generates power using a temperature differential between a hot region 13 and a cooler region 27. Device 10 has an upper substrate 12 and a lower 12' substrate positioned over the top and bottom surfaces of a BiTe alloy-based thermoelectric element 14. The cooler region 27 is shown adjacent lower substrate 12'.

The perspective view of FIG. 5 is upside-down compared to the orientation of the device 10 in FIG. 6. The thermoelectric elements 14a, 14b are electrically in series but thermally in parallel. Thermoelectric elements 14a, 14b are separated by a gap 16. Each element is a "leg." A thermoelectric leg is a single thermoelectric element made of n-type or p-type thermoelectric material used in fabricating a thermoelectric couple, the building block of thermoelectric modules. The geometry of the leg (cross-section to length ratio) is optimized to maximize the performance of the device.

The preferred thermoelectric microdevice preferably has several thousand elements compared to only about 100 to 250 in bulk devices.

The general requirements for substrates 12, 12' include a high thermal conductivity and a high electrical resistivity. Suitable materials include diamond, alumina, aluminum nitride, high resistivity silicon, and other such materials having similar properties. Substrates 12, 12' may be in bulk form, e.g., about 100–1000 μm thick, e.g., 300 μm. The overall thickness of device 10 may be about 200–2000 μm, e.g., 700 μm, in some configurations. The exact dimensions are linked to the thermal environment and requirements of the device.

Thermoelectric material 14 is composed of adjacent, alternately spaced p-doped 14a and n-doped 14b legs of BiTe alloy semiconductor material. P- and n-doped legs 14a and 14b are formed by doping BiTe alloys with suitable elements as described below. Thermoelectric thick film material 14 may be about 1–100 μm thick, e.g., 50 μm. These BiTe alloy materials are preferably not bulk materials, but are deposited using microfabrication techniques, electrochemical deposition, vapor deposition, sputtering, etc. as described in considerable detail below. Each leg is separated from substrates 12, 12' by an upper 11 and a lower 11' multi-layer stack structure.

Multi-layer structures 11, 11' include metallization layers 18, 18a, 18' for metallizing a portion of the substrates' surfaces. Metallization layers 18, 18a, 18' facilitate adhesion between each substrate and subsequent layers of upper stack structures 11, 11'. Metallization layers 18, 18a, 18' also provide good mechanical connections between the substrate and a diffusion barrier. In preferred embodiments, the metallization layers include titanium, chromium, or any other electrically-conductive material which can be used to bond subsequent layers.

Outer diffusion barrier layers 20, 20a, 20' are sandwiched between metallization layers 18, 18a, 18' and copper layers 22, 22a, 22'. Outer diffusion barrier layers 20, 20a, 20' prevent diffusion of copper or other material into the substrate and metallization layers. Copper diffusion into these layers causes problems such as disruption of the mechanical bond between the substrate and the metallization layers. Outer diffusion barrier layers 20, 20a, 20' preferably include ternary alloys of metal-Si-N or any other material suitable to prevent interdiffusion of copper.

High conductivity material, e.g., copper, is used for conductive layers 22, 22' and 22a as it has a high electrical conductivity. These are used to efficiently conduct current from the p- and n-doped thermoelectric legs 14a and 14b.

Copper is also an excellent thermal conductor and is used during operation to conduct heat from/to the substrates to/from the thermoelectric material.

Conductive layer 22 is connected via solder bumps 24, 24a to inner diffusion barrier layers 26, 26a. A wide range of metal alloys can be used as solder, with lead, tin, and indium alloys being preferred. Copper provides a solder-wettable surface when coated with a thin layer of nickel or palladium, and thus it may be desirable to deposit one of these materials prior to forming the solder. Generally, the solder should be placed between the Cu layer and the thermoelectric material: the specific location is variable.

The other materials are described in our previous U.S. Pat. No. 5,712,448, which is incorporated by reference.

The materials, thicknesses, and primary functions of each layer in the stack structures are summarized in Table I, below.

TABLE I

Layers of the Device

| Layer | Ref. Numeral | Material | Thickness | Function |
|---|---|---|---|---|
| Heat conducting substrates | 12,12' | diamond | 100–1000 $\mu$m | thermal conductor |
| Metallization layers | 18,18' | Ti, Cr | 0.02 $\mu$m | adhesion |
| Outer diffusion barrier layers | 20,20' | metal-Si-N, Pt | 0.1 $\mu$m | prevents diffusion of Cu into substrate |
| Conducting layers | 22, 22' | Cu | 0.1–5 $\mu$m | thermal/electrical conductor |
| Inner diffusion barrier layers | 26,26', | metal-Si-N, Pt | 0.1 $\mu$m | prevents diffusion of Cu into thermoelectric device element |
| Electrical contact layers | 28,28' | Trans. metals | 0.1 $\mu$m | electrical contact |
| Thermoelectric material | 14, 14a, 14b | BiTe (n, p-doped) or alloys thereof | 5–100 $\mu$m more preferably 20–50 $\mu$m | thermoelectric generator |

Preferably, there are 1000–20,000 legs, more preferably 2500–5000 legs.

Figure 7:
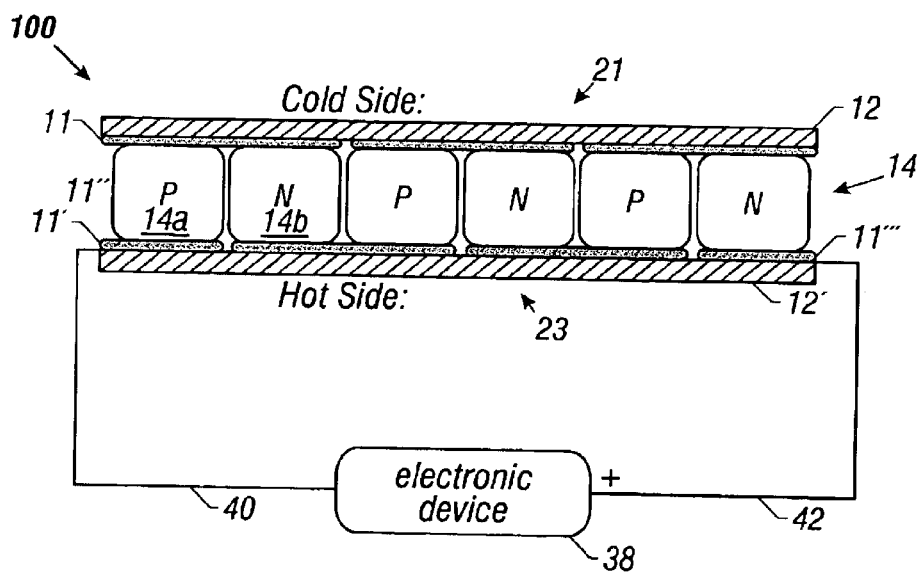
FIG. 7 shows a simplified electronic layout of the preferred thermoelectric device.

FIG. 7 shows a simplified cross-section side view of device 10 shown as using only six thermoelectric legs. The six legs include a series of alternating p-doped 14a and n-doped 14b legs that are electrically connected in series by multi-layer upper 11 and lower 11' stack structures. Diamond layers 12, 12' provide a heat path to operate the devices in thermal parallel.

Device 10 operates based on power produced by a thermal gradient. For purposes of discussion, multi-layer upper stack structure 11 is assumed to be in contact with "cold" side 21 that is at a lower temperature than multi-layer lower stack structure 11' in contact with "hot" side 23. Thus, a thermal gradient is established between upper stack structure 11 and lower stack structure 11'. This causes an electrical potential to be produced between the hot and cold sides of the thermoelectric generator because of the Seebeck effect. A current will pass through the legs in one direction (shown in the figure as clockwise) if the thermoelectric generator is connected to an external load, such as electronic device 38.

This voltage and subsequent current can be used to power an electronic device 38 with or without a suitable power conditioning element 39.

For example, in the case of a wristwatch, upper substrate 12 is in thermal contact with the ambient air. Lower substrate 12' is in thermal contact with the user's wrist, which is presumed to be warmer than the ambient air.

The generated current passes through a lead 40 to a first portion 11" of lower stack structure 11'. Current flows from lower stack structure 11', through first p-doped leg 14a, and into upper stack structure 11. The current then proceeds to pass through successive p-doped and n-doped legs, finally exiting through a portion 11'" of lower stack structure 11'. The current then passes through a lead 42 back to electrical device 38 to complete the circuit.

Each p- and n-doped leg of the thermoelectric material simultaneously creates a voltage from "cold" side 21, through the thermoelectric material, and to "hot side" 23.

During operation, heat first passes from the hot region to lower substrate 12'. As described above, heat is rapidly spread out and conducted due to the high thermal conductivity of the substrate. This process accumulates heat and directs the same to the thermoelectric elements. The presence of cold side 21 of the thermoelectric material results in a thermal gradient.

Figure 2:
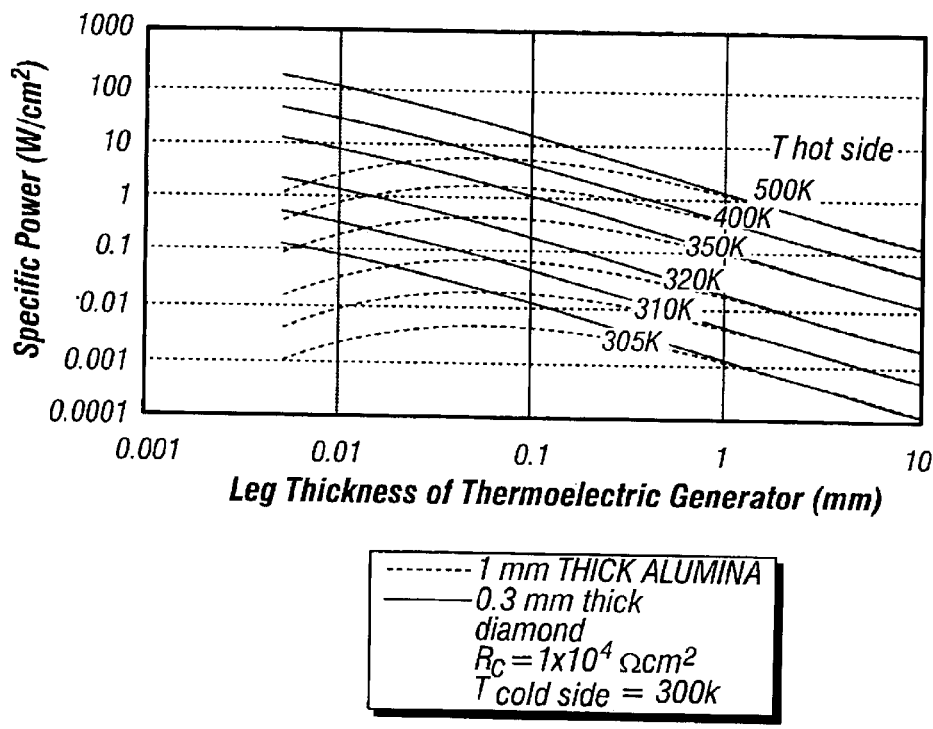
FIG. 2 shows a relationship between leg thickness and specific power.
Figure 3:
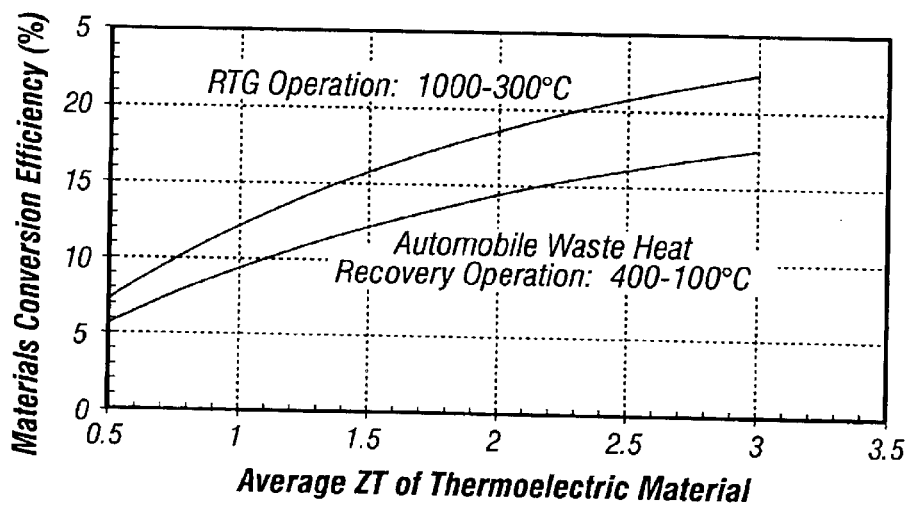
FIG. 3 shows a relationship between conversion efficiency and ZT.

FIG. 2 demonstrates that the electrical power density, i.e., the electrical power per unit area generated by the device, is inversely proportional to the leg thickness for a given thermal gradient. Thus, thin thermoelectric legs (e.g., thicknesses of about 100 $\mu$m or less) result in high power densities. Details of such dependencies are described in "Thermoelectric Power Conversion," by Jean-Pierre Fleurial, incorporated by reference.

Devices operating with low $\Delta T$ heat sources can require larger numbers of legs and electrical connections for operation. The overall effect can be to substantially increase the internal electrical resistance within the device and degrade its performance. Conversely, the thermal resistance decreases as the thickness of the thermoelectric legs decreases. These effects can decrease the efficiency of the device. Use of high thermal conductivity substrates (e.g., diamond) to conduct heat into and away from the thermoelectric elements is thus important for efficient operation of small-scale devices such as consumer electronics.

The electrical and thermal properties of the multi-layer upper and lower stack structures also affect the performance of the device. The efficiency of the device decreases as the electrical contact resistance between the n- and p-doped legs containing the thermoelectric material is increased. The development of ohmic contacts to the p- and n-doped legs becomes a large factor in determining the performance as the thickness of the thermoelectric material decreases. For instance, the electrical contact resistance between a bulk thermoelectric leg and the multi-layer stack structure is typically about $10^{-5}$ $\Omega$-cm$^2$ for a device having a leg thickness greater than 1 millimeter. However, for a device with a leg thickness between 5–100 $\mu$m, e.g., 10 $\mu$m, the electrical contact resistance between the stack structure and the leg must be reduced to about $10^{-6}$ $\Omega$-cm$^2$ to prevent a substantial decrease in the energy conversion efficiency and the power density of device 10.

The device can be used to generate power under both steady-state and transient conditions. The device generally operates at high power levels proportional to the temperature differential of the hot and cold surfaces. For applications where the temperature differential is not constant, additional power conditioning may be required. Such transient conditions may be accounted for and dampened by use of the power conditioning module 39.

In a wristwatch, the resulting output voltage Vout may vary somewhat throughout the typical user's day as the ambient temperature and the user's biological temperature (e.g., temperature of the user's wrist) varies. Power control module 21 may be designed to account for such variations.

Power control module 39 can include a power storage element, e.g., a rechargeable battery or a capacitor which stores the energy generated by the device at times when power output is above that needed to operate the load, such as a chronometer. Power control module 39 releases energy when power output is below that needed for operation. In many cases, power control module 39 will be an active element. Power control module 39 effectively reduces power spikes in the device to improve performance.

During steady-state operation, the device may continually generate power for long periods of time. In this case, current is continuously generated by the device under a thermal gradient to effectively power the electronic device. In this situation, a power conditioning module may not be required.

Fabrication

The multi-layer stack structure shown in FIGS. 5–6 is initially fabricated by depositing the conducting and diffusion barrier layers on a substrate. In general, all layers are formed and patterned using fabrication techniques that are commonly used in microelectronics. For example, metals are sputtered, vacuum evaporated, or plasma deposited in reaction chambers as films. The processes for forming the different layers of the stack structure (especially the metallization and copper layers) may be performed in the same reaction chamber. Likewise, the thick film thermoelectric legs are typically deposited or attached to the stack structures using a separate reaction chamber or an electrochemical bath depending on the deposition technique as described below.

In a preferred fabrication method, the lower substrate is metallized to improve its adhesion to the diffusion barrier layers of the multi-layer stack structure. Metallization is performed by depositing a thin metal film on a surface of the substrate. The metallization layer is followed by sequential deposition of the outer diffusion barrier, copper, inner diffusion barrier, electrical contact, thermoelectric material, electrical contact, diffusion barrier, and solder bump.

The upper substrate is sequentially coated with metallization, diffusion barrier, and copper layers. These layers are preferably patterned on the upper substrate at the same time that the lower substrate is patterned. This can be done by placing the substrates side-by-side in the appropriate reaction chambers. As described above, deposition is preferably performed using plasma or sputter deposition or vacuum evaporation. The desired pattern of each film is then obtained using spatially filtering masks, photolithography, and etchants commonly used in microelectronics fabrication.

Diffusion Barriers

The fabrication of thick film thermoelectric microdevices is based on the deposition of films in the 10–100 micron thickness range as well as the prevention of degradation of the thermoelectric material upon post-deposition heat treatments of the thermoelectric elements or operation of the completed device at elevated temperatures. The commonly-used diffusion barrier materials do not prevent the diffusion of Cu into the thermoelectric elements.

A preferred diffusion barrier prevents performance degradation of thermoelectric devices due to Cu or solder migration into the thermoelectric elements. Tests performed to measure such diffusion have shown no migration through the inventive barriers at 350° C. for 1 hour. By comparison, commonly used barrier materials such as Ni, Pt, and Pd indicated Cu diffusion at 200° C. after 1 hour. The formation of diffusion barriers is described in "Films of Ni-7% V, . ", J. Appi Phys, 31 (1998). This describes that high electrical conductivity materials such as aluminum and copper are commonly used as the interconnection material in IC, silicon based, and in thermoelectric, BiTe based, devices. However, diffusion of these high conductivity materials into the silicon or BiTe can result in a reduction of performance so it is frequently necessary to provide a barrier to prevent interdiffusion. Metal films of Ni-7 at% V1 Pt and Pd were shown to fail to prevent interdiffusion of Cu and BiTe after a few hours at 200° C. However, the $Ta_{40}Si_{14}N_{46}$ barrier preserves the integrity of the contact after anneals of 200° C. for 50 hours and 350° C. for 1 hour.

A summary of the parameters of the sputtered films is shown in Table II.

TABLE II

| Cleaning: | Acetone and Isopropanol (both ea. 30"), pressurized air | | | |
|---|---|---|---|---|
| Sputtering Base pressure: | $-5.10^{-7}$ mbar | | | |
| Material | Target | Thickness | Gas flow | Total gas pressure |
| TaSi | TaSi | 50 nm | Ar, 60sccm | 4 mbar |
| Cu | Cu | 1 μm | Ar, 60sccm | 10 mbar |
| TaSiN | TaSi | 100 nm | Ar, 60sccm/N 2sccm | 4 mbar |
| Pt | Pt | 0.5 μm | Ar, 23sccm | 5 mbar |

A solder bump 24 may be electroplated on a region of each diffusion barrier 26. The upper and lower substrates are stacked on top of each other and aligned. The substrates are then heated to a temperature which melts solder bump 24 and solders the copper layer of the upper substrate to the exposed inner diffusion barrier layer of the lower substrate. Conventional soldering or brazing is not the preferred method for attaching the copper and diffusion barrier layers due to the small size of the doped legs. Solder bump 24 collapses and fuses the copper layer 22 and the diffusion barrier 26 layer on heating to its melting temperature. Surface tension of the molten solder prevents bridging between the neighboring doped legs of the thermoelectric material, thereby reducing the probability of electrical shorting during operation.

The electro-chemical deposition (ECD) method for thermoelectric element growth has a significant advantage for device fabrication. Since the thermoelectric elements can be grown on a substrate, the substrate can be coated with a mask to cause the elements to grow on an interconnect bus pattern already on the substrate. By doing this, conventional IC fabrication technologies can be adapted to the production on micro thermoelectric devices for volume production.

Thermoelectric films may also be deposited on the stack structures using other well-known techniques such as molecular beam epitaxy, CVD, sputtering, evaporation.

Heat treating, as described above in connection with ECD-grown films, is particularly important for films deposited by sputtering or flash evaporation. Heat treatment improves crystallinity in grain size. Heat treatment also anneals carrier generating defects, such as tellurium vacancies, or anti-structure defects, and other defects.

The patterns of the thermoelectric legs are isolated to assure that current flow only occurs through the doped legs. Preferably, a "checkerboard" pattern is formed. Typical spacing between the legs is between 5 and 100 $\mu$m. A typical cross section of both the n- and p-doped legs within this pattern is 10×10 to 100×100 $\mu$m.

One way of depositing the thermoelectric device legs is by electrodeposition. These legs have typical dimensions of much less than a millimeter. In particular, the thermoelectric device legs may have sizes of a few $\mu$ms to a few tens-of-$\mu$m in width and/or length.

In a typical fabrication process, once contact layer 28' is deposited as described above, the structure is placed in an electrodeposition bath and forms the cathode (or working electrode). Electro-chemical deposition is performed as described below. Photoresist is previously applied to define the area to be patterned. Patterns are etched onto the photoresist layer using photolithography where legs are desired. A shallow Pt layer may be deposited on the structure prior to the structure entering the bath to protect the already-deposited layers.

ECD is effectively used to deposit thick BiTe alloy films. Electro-chemical deposition, which has been extensively used for CdSe, CdTe, and alloys, achieves a high deposition rate on metallic substrates, and may be performed at room temperature. Thus, electro-chemical deposition is inexpensive and scalable.

ECD of N-type Bite Alloy Thick Films

For electrodeposition of n-type legs, the bath typically includes Bi, Te, Sb, and Se. With reference to a standard calomel electrode, voltages of about −5 mV up to about −60 mV can be used to deposit n-type BiTe alloys, e.g., $Bi_2Te_3$ or $Bi_2Te_{3-x}Se_x$ or $Bi_{x-2}Sb_xTe_{3-y}Se_y$.

In particular, bismuth and tellurium metals dissolve in nitric acid ($HNO_3$) to make the oxide anions $BiO^+$ and $HTeO_2^{2+}$. The binary compound BiTe alloy is insoluble in dilute $HNO_3$, so the reduction of $HTeO_2^+$ to $Te^{2-}$ at an electrode surface will result in the precicpitation of BiTe alloys on the surface. The overall reaction for the process is:

To realize the production of stoichiometric BiTe alloy thick films with the desired thermoelectric properties, the process parameters must be optimized. These parameters include: electrolyte pH; molar concentrations of the Bi and thermoelectric in the $HNO_3$ solution; Bi and thermoelectric feedstock materials; temperature; electrolyte stirring; substrate surface finish; electrode geometry; voltage; and current density. By introducing suitable amounts of Se into the electrolyte, optimum $Bi_2Te_{3-x}Se_x$ alloy compositions ($0.15<x<0.6$) can be prepared by the same technique.

Electro-chemical deposition of Bi, Te and Se from aqueous solutions of nitric acid may be performed as described below to form materials with good thermoelectric properties. Electro-chemical deposition tests have been performed to validate the growth of $Bi_2Te_{3-x}Se_x$ n-type thermoelectric elements with satisfactory thermoelectric performance. Because of the multiplicity of parameters possible, the preferred configuration for the electrochemical deposition process, and its rationale, is discussed below.

Setup

Figure 8:
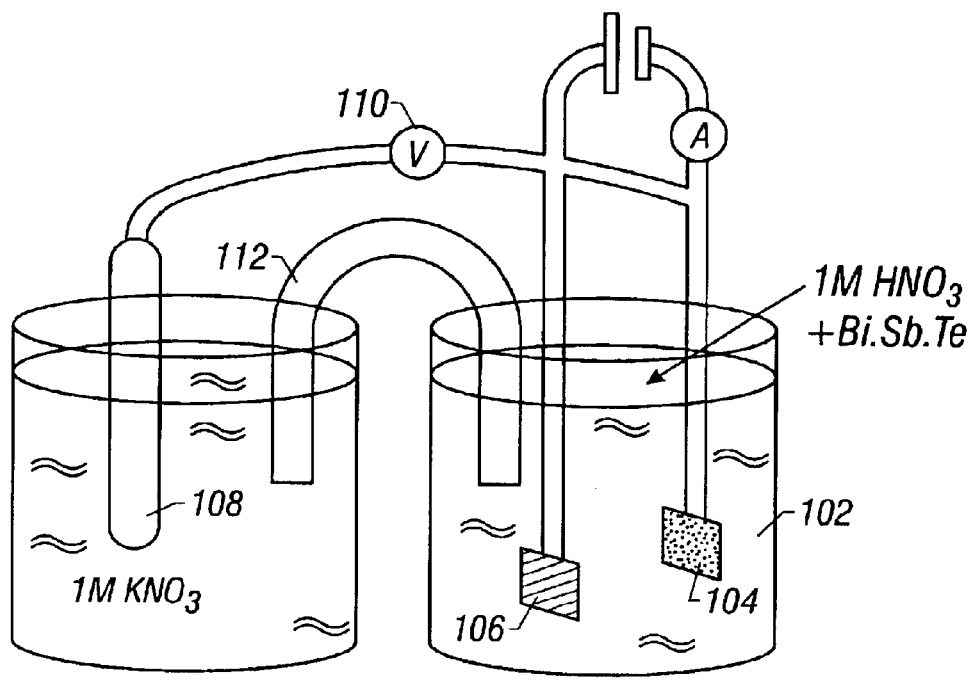
FIG. 8 shows a formation setup for the preferred device.

A typical configuration for producing such n-type thick films is illustrated in FIG. 8. The main elements of the setup include: electrolyte 102 in a glass container; cathode electrode 104 which forms the substrate for n- or p-type thermoelectric element growth; platinum anode electrode 106, also referred to as the "counter electrode"; reference electrode 108 in another glass container; stirrers as needed; a power supply system 110 to provide a constant monitored voltage or current during deposition; and a bridge 112 with saturated $KNO_3$ connecting the glass containers. The electro-chemical deposition can be performed in an open beaker while using normal laboratory precautions when working with low pH acid-aqueous solutions.

Electrolyte

Bi, Sb, Te, and Se are soluble in acids (both the metals and their compounds) so the electrolyte can be an acid solution. Common acids such as hydrochloric (HCl) and sulfuric ($H_2SO_4$) acids may be used for the electrolyte so long as they do not dissolve other materials to be used in the device fabrication. An aqueous solution of nitric acid ($HNO_3$) may be preferable for the electrolyte.

Electrolyte pH

The electrolyte pH will have an important effect upon the electrochemical deposition process since it will determine the concentration of the Bi, Sb, Te, and Se ions in solution. The concentrations of these ions in turn influence the rate of deposition and thus the rate of film growth. High quality films can be grown in a 1 molar aqueous solution of nitric acid, which corresponds to a pH of 0. pH levels of −1 to +1 may also be used. At this pH, Bi, Te, and Se dissolve to concentrations useful for electrochemical deposition while the electrodeposited BiTe alloy is not dissolved. Additionally, this pH value is compatible with the other materials (metallizations, photoresist, substrates, etc.) that operate in the electrolyte. A zero pH enables a high solubility of tellurium in the one molar nitric acid solution. In particular, at a zero pH, the Te concentration equals 10 mM which is very close to the solubility limit.

Electrolyte Temperature

Room temperature (18° C.) operation produces very uniform BiTe alloy films that display good thermoelectric properties. Elevated or reduced temperatures do not appear to offer any advantages.

Electrolyte Agitation (Stirring)

The electrochemical deposition process is most likely diffusion-limited. That is, the region of the electrolyte in the immediate proximity of the film is constantly being depleted of the anions in solution. As such, it may be important to agitate or stir the solution so that the anion population is replenished. If there were no agitation, the source of anions would be "diffusion" limited. Tests demonstrated that a simple magnetic stirrer was sufficient to provide bulk movement of the electrolyte.

The setup can also be run in an inert atmosphere such as Ar by purging the electro-chemical deposition cell from oxygen with bubbling Ar into the electrolyte. In some cases this can lead to improved film morphology since there is no generation of hydrogen peroxide gas at the working electrode.

Working Electrode/Photoresist

The working electrode is the substrate with the interconnect bus and photoresist defining where the n-type material is deposited.

The substrate is an essential component of the integrated microcooler/microgenerator devices. The substrate will serve the purpose of conducting the heat into and out of the active components (i.e., the n-type and the p-type elements) of the devices. The substrate will also have the interconnect electrical bus deposited onto it so that the n- and p-type elements can be grown in the proper location so as to create a complete electrical circuit.

The interconnect bus work may be attached to the substrate as a thin film in a pattern suitable for depositing the n-type elements at the desired location. This patterning is made possible by coating the substrate with a thick photoresist, preferably of a thickness at least the same as the desired height of the thermoelectric element. The photoresist may then have holes etched into it in the pattern corresponding to the location of the n-type thermoelectric elements. The pattern in the photoresist would then correspond to the pattern of the interconnect bus on the substrate.

The interconnect bus should have low chemical resistance. Copper is a good material. However, copper can diffuse into BiTe alloy which in turn degrades thermoelectric performance. Thus, the bus is preferably coated with the diffusion barrier layer prior to copper coating. The final coating on top of this diffusion barrier layer has to be compatible with the aqueous acid solution. A suitable material is platinum (Pt) and so this is the preferred material onto which the BiTe alloy is electrodeposited. A contact layer such as Bi can also be deposited on top of the Pt coating prior to BiTe alloy deposition in order to improve mechanical bonding after suitable heat treatments. To assure uniform growth and a smooth texture to the electrochemical deposition elements, the substrate may have a smooth surface. The substrate is connected to the negative terminal of the deposition power supply.

Counter-Electrode

The counter electrode 106 completes the circuit in the electro-chemical deposition electrolyte. Since 106 is the positive, or anode, electrode, nothing is deposited on it. Thus, the counter electrode is preferably compatible with the aqueous acid solution and for this purpose, platinum may be used.

Reference Electrode

The reference electrode 108 should provide a stable measure of the deposition potential so that the power supply can be operated at the desired voltage. This is particularly important since the voltage can influence the composition and uniformity of the deposited film. A calomel (Hg/HgCl) electrode was used since it is compatible with the electrolyte and the electro-chemical deposition operating conditions. Since there is the possibility of a slow leakage of Cl from the calomel electrode, it is placed in a second container and filled with a $KNO_3$ solution. A capillary bridge filled with glass wool and $KNO_3$ was used to make the complete electrical connection to the electro-deposition solution.

A no-leak reference electrode (such as Ag/AgCl) can also be used directly into the electrolyte solution, thus eliminating the need for a salt bridge and a separate beaker.

Bi Feedstock and Concentration

Bismuth, in the elemental metallic form, is soluble in an aqueous solution of $HNO_3$. For this reason, it was the preferred source of Bi in the electrolyte. Bi could, of course, have been supplied-in other compound forms. However, there may be concern about interference from other elements introduced into the electrolyte. The concentration of dissolved Bi, [Bi], is an important parameter that may be coordinated with the concentration of Te, [Te], (or [Te+Se]) to assure the growth of films with the preferred [Te]/[Bi] ratio (or [Te+Se]/[Bi+Sb] ratio). This ratio will have an effect upon the thermoelectric performance of the deposited films. The actual mole ratios in solution are discussed below. Because of the low pH of the electrolyte, Bi could be dissolved to concentration in the range of 0.5 to $10 \times 10^{-3}$M. However, for high quality n-type thermoelectric thick films, with acceptable growth rates, concentrations in the range of 5 to $10 \times 10^{-3}$M may be the most productive.

Sb Feedstock and Concentration

Figure 9:
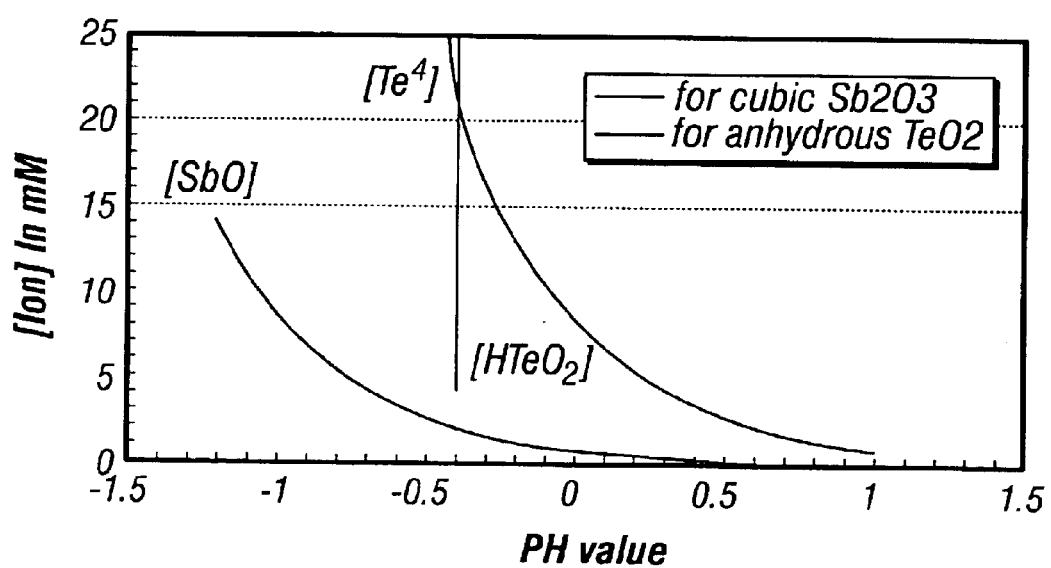
FIG. 9 shows a relationship between deposition and pH in the preferred layout.

The preferred feedstock for the antimony was the elemental form, although $Sb_2O_3$ could also be used without introducing additional elements into the electrolyte. Sb salts are also suitable but they typically introduce contaminants such as Cl or F. FIG. 9 shows the solubility of the different materials. Compared to Bi or Te, Sb has a more limited solubility, up to $9 \times 10^{-4}$M/l, in the 1 molar nitric acid solution, so Sb was the determining constituent for the Bi and thermoelectric concentrations.

Figure 15:
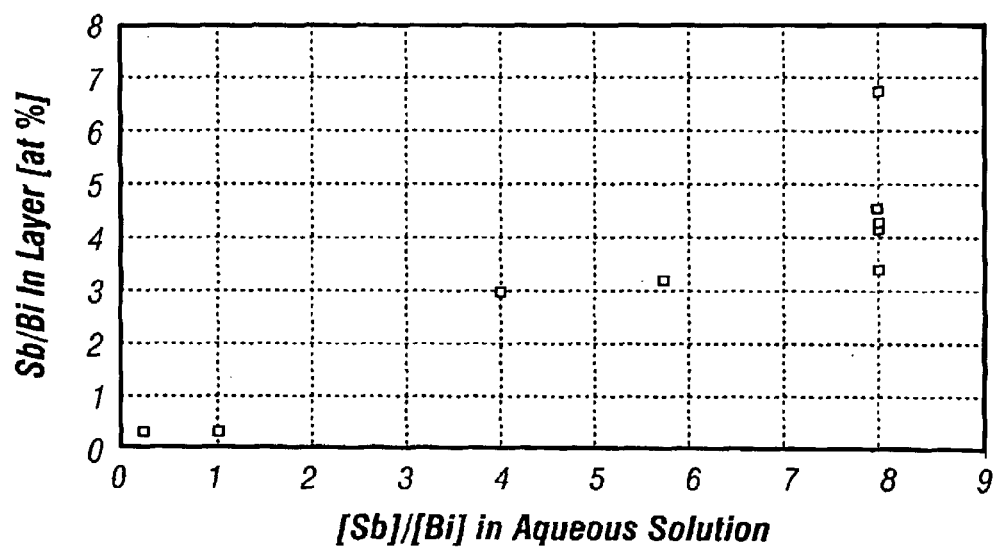
FIG. 15 shows a relationship between the doped concentration in solution and the doped concentration which is actually applied.

Without any chelating agent, and to obtain stoichiometric BiTe alloy films, typical Sb concentrations used for electrochemical deposition were in the range of 0.1 to $0.9 \times 10^{-3}$M. Using these concentrations, the complete range of BiTe alloy solid solutions could be obtained, as shown in FIG. 15. However, due to the low concentrations of the elements in the electrolyte, typical deposition rates for the film were on the order of 1 μm/hour (typical current densities were less than 0.6 mA/cm$^2$). To increase the deposition rate, higher Sb concentrations were prepared by introducing chelating agents such as tartaric acid ($C_4H_6O_6$) EDTA and EGTA. Using tartaric acid (a very weak acid that does not change the overall solution pH), [Sb] concentrations up to $8\times10^{-2}$M can be prepared (two orders of magnitude higher than without tartaric acid) and are stable at room temperature. E.g., for a calculated [Sb] solubility of [Sb]=0.85 mM, the achieved [Sb] was 0.7 mM at pH=0.

Experiments show that films deposited at high electrochemical deposition voltages and low antimony concentrations result in films having a rough, sponge-like surface. In addition, these films are thin due to the low deposition rate (1–2 μm per hour). In contrast, films deposited at a lower voltage but at higher antimony concentrations were considerably smoother, and could be grown more rapidly (e.g., 10 μm per hour).

Te Feedstock and Concentration

As with Bi, the elemental form of thermoelectric is soluble in 1 molar aqueous nitric acid. This may be the preferred form of feedstock since other elements would not be introduced into the solution. Te is also soluble in the range of 0.5 to $10\times10^{-3}$M. To facilitate rapid film growth, the concentration of greatest interest was in the range of 5 to $10\times10^{-3}$M.

Se Feedstock and Concentration

The elemental form of Se is soluble in 1 molar aqueous nitric acid. Se is also soluble in the range of 0.5 to $10\times10^{-3}$M. To facilitate rapid film growth and to achieve the desired BiTe alloy composition (0.15<x<0.45), the concentrations of greatest interest were in the range of 0.5 to $2.5\times10^{-3}$M.

[Te]/[Bi] Mole Ratio in Solution

One objective was stoichiometric BiTe alloy films for their optimized thermoelectric performance. Other parameters affect the uniformity and composition of the electrochemical deposition films, but certainly the mole ratio has a significant effect. For depositing BiTe alloys, [Te]/[Bi] mole ratios of 1 to 2 were evaluated (i.e., the [Bi]/[Te] ratio was determined to be in the range of 0.7–0.8 following tests where the ratio was varied from 0.1 to 3.5). Typical concentrations that produced acceptable films were $10\times10^{-3}$M of Te and $8\times10^{-3}$M of Bi ([Te]/[Bi]=1.25). For depositing BiTe alloy compositions (with 0.15<x<0.45), it was determined that similar anion to cation mole ratios could be used ([Te+Se]/[Bi]=1.1 to 1.5) by adding small amounts of Se to the electrolyte. [Te]/[Se] mole ratio values of 5 to 10 were used to achieve the desired ternary compositions.

These ratios were found to be appropriate if concentrations are kept fairly high, greater than about 4 mM. The results are significantly different if using low-element concentrations, such as around 1 mM.

N-type $Bi_{2+x}Sb_xTe_3$ films were also prepared by using a suitable electrolyte composition [Bi]-0.4[Sb]-1.6[Te]-0.7 and 2 mM $C_4H_6O_6$ and voltage ~60 mV.

ECD Voltage and Current Density

Figure 10:
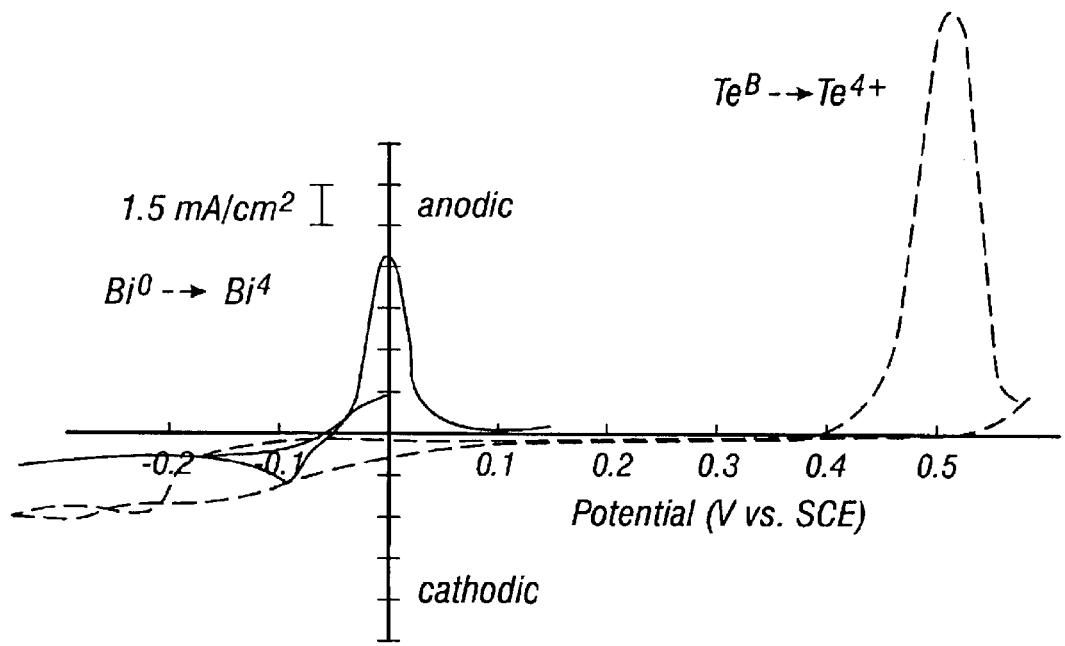
FIG. 10 shows a voltammogram of the preferred materials used according to the preferred layout.

Voltammograms were measured for the reduction of both $BiO^+$ and $HTeO_2^+$ on platinum substrates. FIG. 10 shows a voltammogram of Bi and Te deposited on platinum. A 7 mM concentration of Bi is provided, along with a 10 mM concentration of Te in 1M nitric acid. Working and counterelectrodes of platinum are used.

Figure 11:
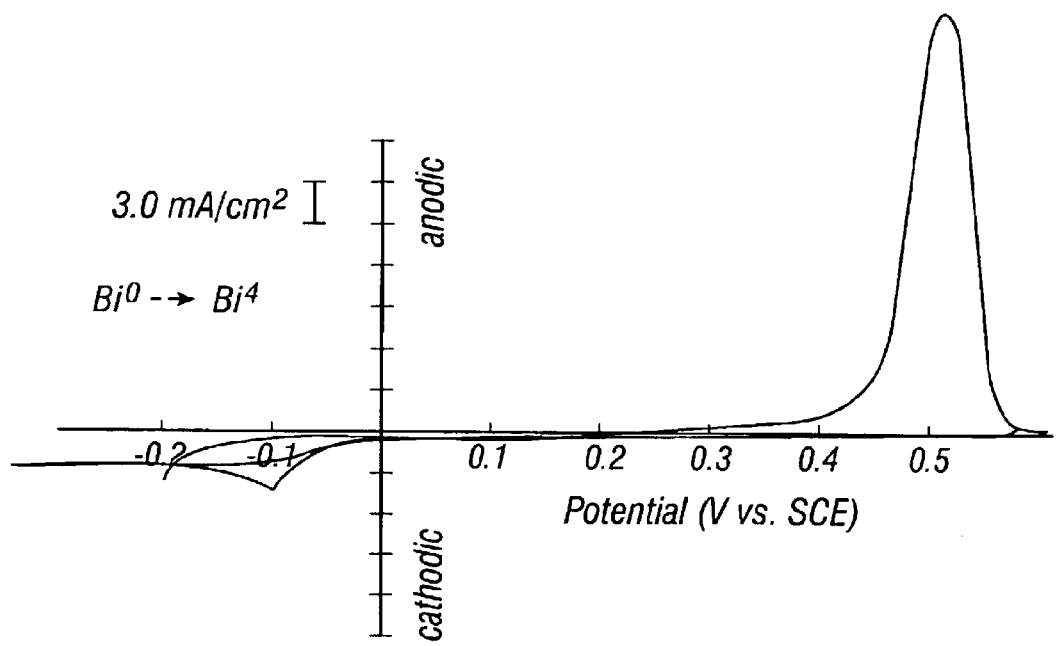
FIG. 11 shows a relationship between anodic and cathodic potentials and deposition characteristics for the preferred layout.
Figure 12:
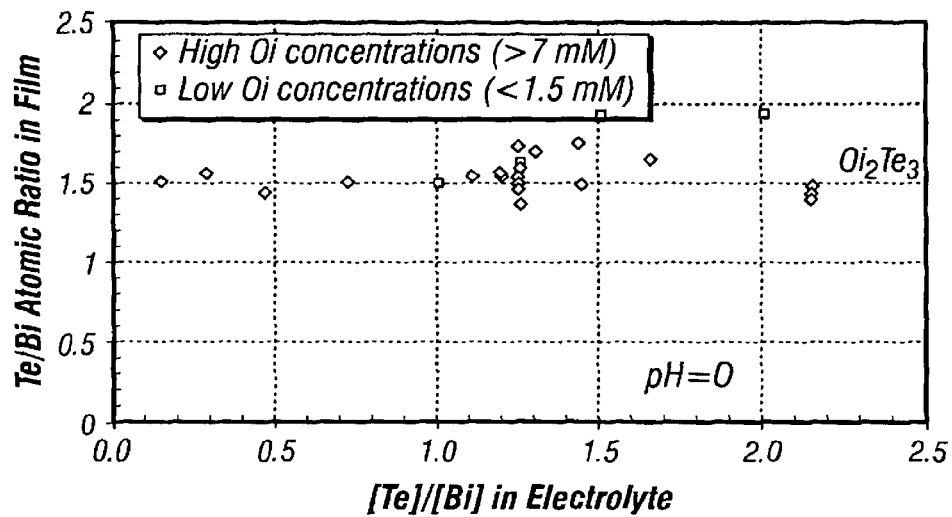
FIG. 12 shows the influence of electrolyte concentrations on stoichiometry.
Figure 13:
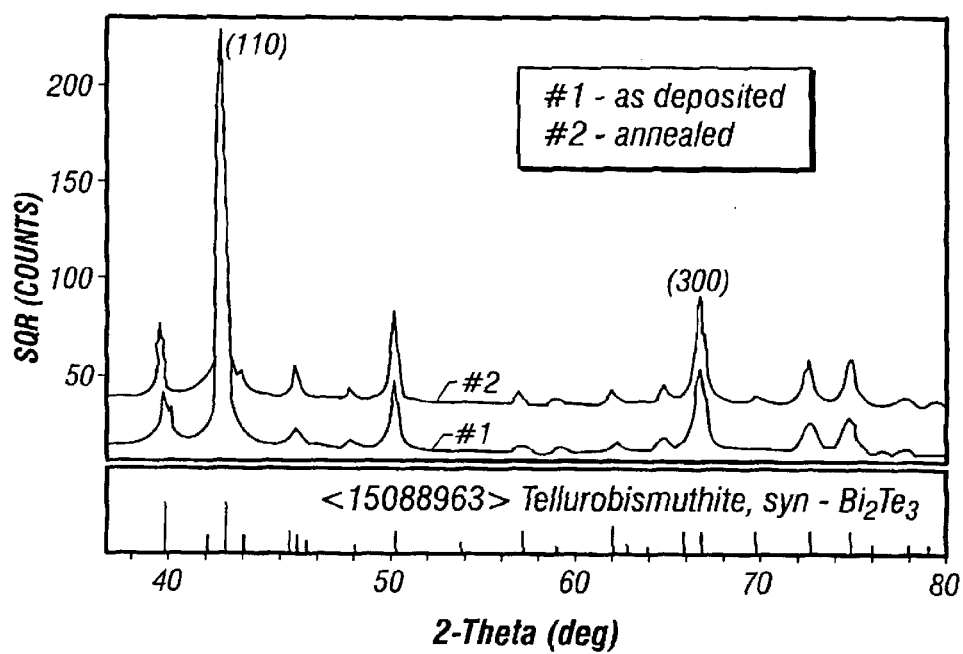
FIG. 13 shows the characteristics of the electrochemically deposited BiTe alloy.

Both Bi and Te were observed to deposit at voltages in the range of 0.0 to −0.2 V versus a standard Hg/HgCl calomel electrode. A co-deposition voltammogram for a Bi/Te electrolyte is shown in FIG. 11. Thus, co-deposition of $Bi_2Te_3$ in a range of voltages from 0 to −0.1 V may be performed. Development of the electrochemical deposition process has shown that a voltage in the −2 to −10 mV range, versus a standard Hg/HgCl calomel electrode, produces the desired BiTe alloy films. At these voltages, typical current densities are in the range of up to 8 mA/cm$^2$ and produced film growth rates in the range of 1 to 15 μm/hr. Higher voltages may be used, e.g., −60 mV, but higher voltages also tend to produce dendritic growth. The micrographs in FIGS. 20A–20D show 30 μm thick BiTe alloy columns grown within columnar holes initially etched into a thick photoresist layer. FIG. 12 shows the influence of the concentrations of electrolytes on the final film. FIG. 13 shows the x-ray diffraction pattern of a BiTe alloy film, as-deposited and after a short heat treatment.

In addition to the deposition voltage, the growth rate is also controlled by electrolyte stirring, element concentrations, and temperature. Similar deposition voltages were used for depositing $Bi_2Te_{3-x}Se_x$ compositions (with 0.15<x<0.45).

Figure 14:
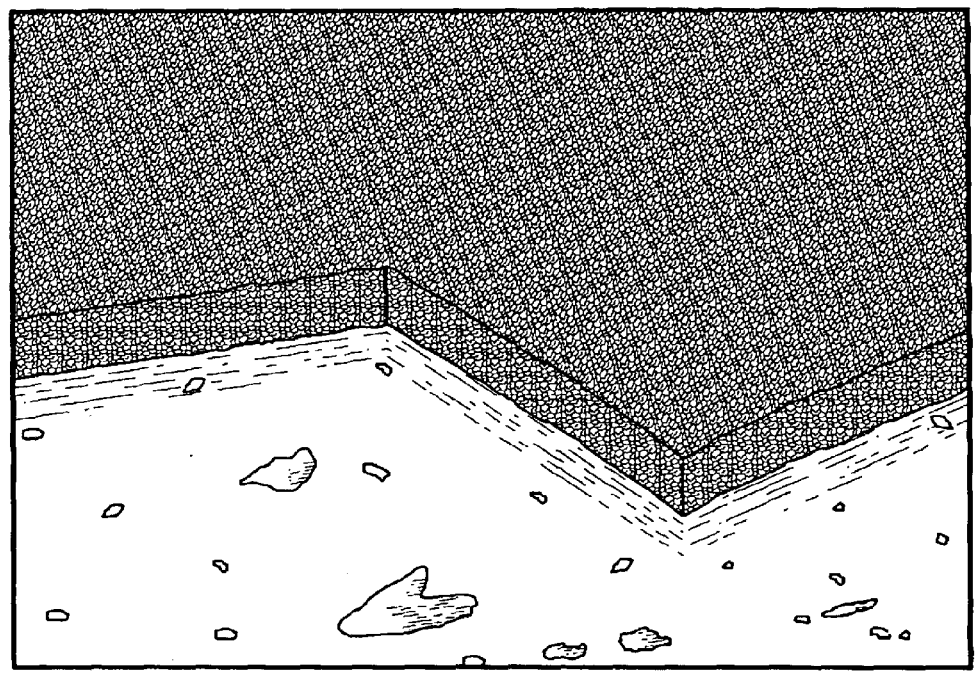
FIG. 14 shows the smoothness and structure of the surface of the electro-chemically grown BiTe film.

FIG. 14 shows a micrograph of ECD-grown BiTe alloy films. Such films may be deposited on a variety of substrates, such as Mo, platinum, stainless steel, metallized silicon, metallized aluminum nitride, and metallized diamond. As may be seen, the top surfaces of such BiTe alloy films are relatively smooth. Their roughness may be less than one micron. Generally, their smoothness depends on substrate texture, roughness, and growth rate.

N-Type Performance

Measurements of the electrical transport properties have been conducted on some of the as-deposited films. Van der Pauw electrical resistivity and Hall effect (coefficient and mobility) are measured in the plane of the deposited films (after removal by delamination from the metallized electrically conducting substrates (for these measurements, the films should be at least 30 μm thick)), and the Seebeck coefficient was measured in a cross-plane direction. For the latter measurement, a small Δ T was applied across the film thickness. In addition, the sample may be left on the electrically conducting substrate (e.g., the Pt substrate) and thermocoupled pressure contacts may be applied. In addition, thermal conductivity measurements may be made using the 3ω technique. The transport property measurements were primarily made at room temperature although some samples were measured in the 80–400K range.

Results show heavily doped n-type behavior with high electron concentrations (~$1\times10^{20}$ cm$^-$) and relatively low Hall mobility values (~15–25 cm$^2$/Vs). Resistivity values (parallel to the C axis) were measured to be P=12 mΩ.cm. These results were true regardless of the deposition voltage provided that [Bi] and [Te] concentrations were several mM (e.g., greater than 4). Seebeck coefficient values ranged from −50 μV/K to over −100 μV/K near room temperature.

$Bi_2Te_{2.9}Se_{0.1}$ alloy films show n-type behavior, although not heavily doped.

Annealing

Figure 18:
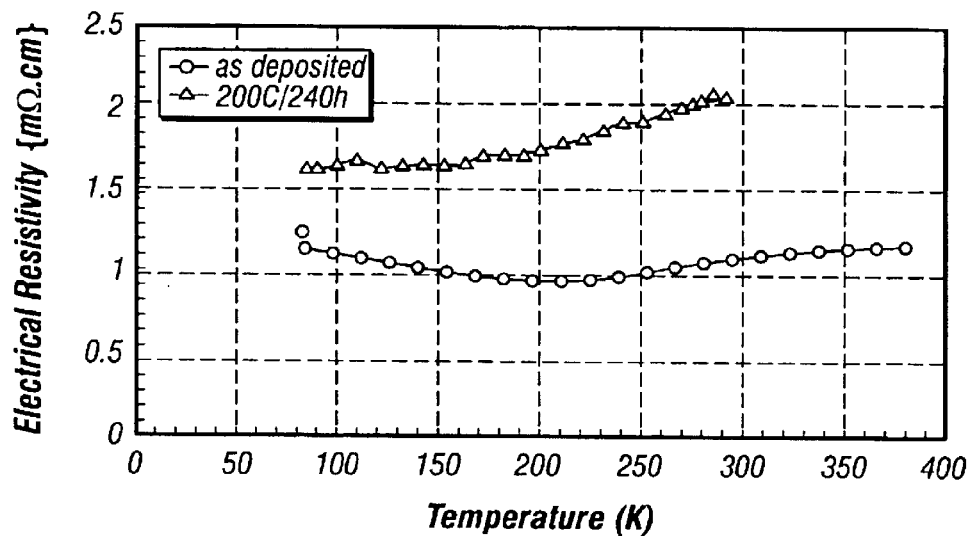
FIG. 18 shows a graph of electrical resistivity as a function of temperature for n-type materials.
Figure 19:
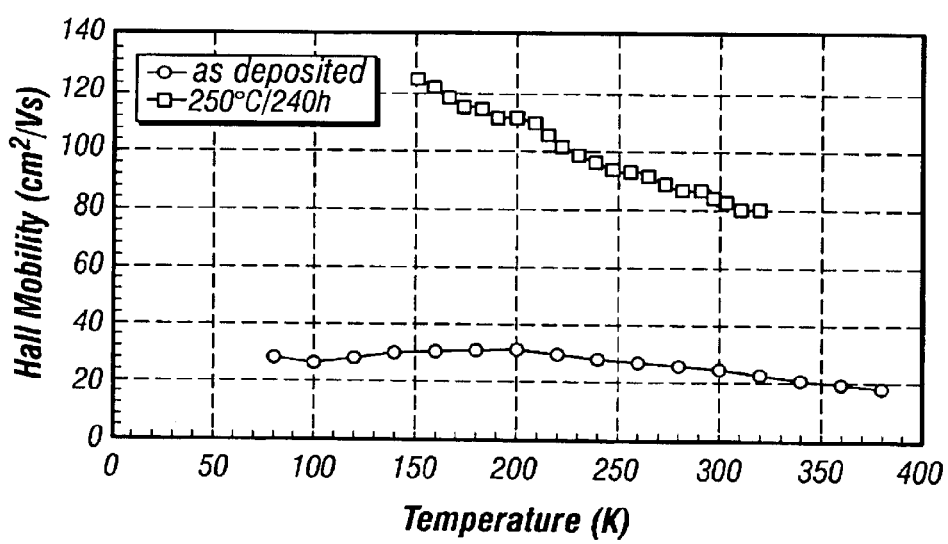
FIG. 19 shows carrier mobility as a function of temperature.
Figure 20A:
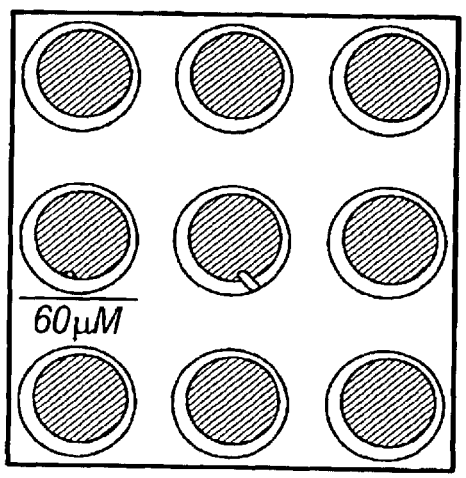
FIGS. 20A–20D show the formation of thick film photoresist deposition and patterning.
Figure 20C:
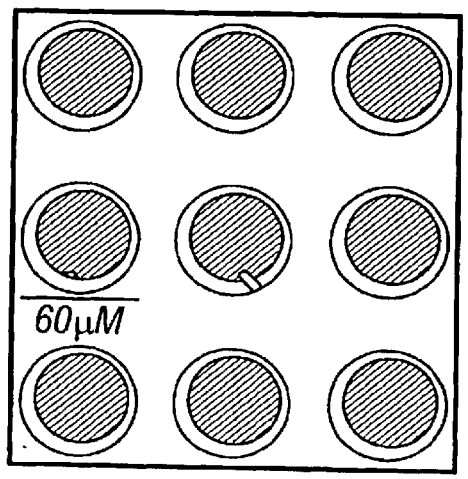
Figure 20B:
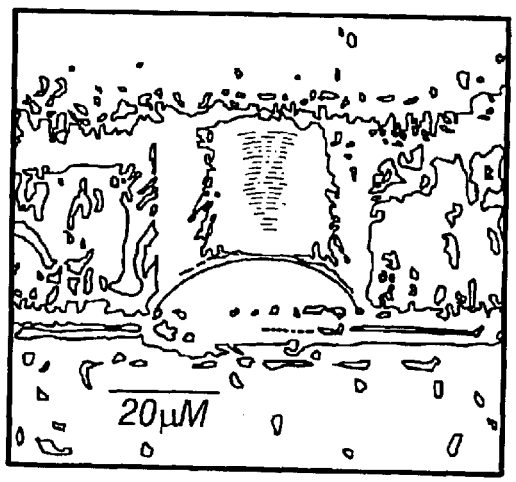
Figure 20D:
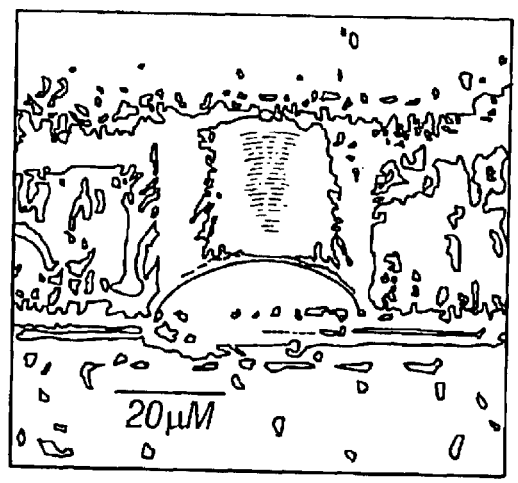

Post-ECD heat treatments improve the thermoelectric performance of the as-deposited thick films. Systematic experiments have shown that heat-treatments in the range of 150 to 300° C. for 1 to 250 hours in an inert atmosphere (or vacuum or hydrogen) promotes annealing of crystal defects responsible for the high electron concentrations and poor carrier mobilities. This is illustrated in FIGS. 18 and 19 by the sharp increase in carrier mobility (FIG. 19) and corresponding decrease in electrical resistivity (FIG. 18) for a $Bi_2Te_3$ film.

Carrier concentration (i.e., doping level) is usually controlled by stoichiometric deviations. The electrical properties are improved by anneals. For example, doping levels decrease when carrier mobilities increase. The Seebeck coefficient increased to −200 μV/K after a 250° C. anneal. In addition, Hall mobility increased to about 80 $cm^2$/Vs. Typical heat treatment conditions in a vacuum environment leading to good thermoelectric properties are 200–300° C. for a few hours or longer, e.g., 250° C. for a 48-hour period. Heat treatments may occur in vacuum, hydrogen atmospheres, or inert atmospheres such as argon.

Since heat treatments are an integral part of the thermoelectric element fabrication process, the role of a stable diffusion barrier is important to prevent rapid degradation from Cu and/or solder contamination of the thermoelectric material.

It is also noted that Sb could be used to increase the Seebeck coefficient and to enhance electrical conductivity; however, too much Sb will cause the deposited film to switch to p-type.

The above describes the growth of the n-type legs. The p-type legs are formed using a similar operation.

ECD of P-type BiTeSb Thick Films

ECD of Bi, Sb, and Te from aqueous solutions of nitric acid is useful and thick films with good thermoelectric properties can be made reliably. Electro-chemical deposition tests have been performed to validate the growth of BiTe alloy p-type thermoelectric elements with satisfactory thermoelectric performance.

Setup

A typical configuration for producing p-type thick films is the same as shown in FIG. 8. The main elements of the setup are an electrolyte in a glass container 102; a cathode electrode 104 (the substrate for thermoelectric element growth); a platinum anode electrode 106 (also referred to as the "counter electrode"); a reference electrode 108; a stirring rod (not shown); and a power supply 110 to provide a constant voltage during deposition. The electro-chemical deposition can be performed in an open beaker while using normal laboratory precautions when working with low pH acid-aqueous solution.

The electrolyte is also the same as described above for n-type, as is the electrolyte pH, Electrolyte Agitation (Stirring), Substrate Interconnect Bus/Photoresist, Counter Electrode, and the Reference Electrode.

Bi Feedstock and Concentration

Because of the low pH of the electrolyte, Bi could be dissolved to concentration in the range of 0.5 to $10 \times 10^{-3}$M. This offers a broad range of concentrations. However, for the deposition of high quality p-type $Sb_2Te_3$-rich $Bi_{2-x}Sb_xTe_3$ thick films with acceptable growth rates, concentrations in the range of 0.5 to $2.0 \times 10^{-3}$M may be the most preferred.

Te Feedstock and Concentration

As with Bi, the elemental form of thermoelectric is soluble in 1 molar aqueous nitric acid. This was the preferred form of feedstock since other elements would not be introduced into the solution. Thermoelectric is also soluble in the range of 0.5 to $10 \times 10^{-3}$M. To facilitate rapid film growth of proper stoichiometry, the concentration of greatest interest was in the range of 1 to $8 \times 10^{-3}$M.

Se Feedstock and Concentration

The elemental form of Se is soluble in 1 molar aqueous nitric acid. Se is also soluble in the range of 0.5 to $10 \times 10^{-3}$M. To facilitate rapid film growth and to achieve the desired BiTe alloy composition (0.15<y<0.45), the concentrations of greatest interest were in the range of 0.5 to $2.5 \times 10^{-3}$M.

ECD Voltage and Current Density

Bi, Sb, and Te were observed to deposit at voltages in the range of −25 to −200 mV versus a standard Hg/HgCl calomel electrode (see the voltammogram of FIG. 10). Thus BiTe alloys may be deposited in a range of voltages from 0 to −0.3 V, e.g., −70 mV to −150 mV. In fact, little or no deposition occurs for voltages less than about −0.08 V. Voltammograms were measured for the reduction of $BiO^+$, $SbO^+$ and $HTeO_2^+$ on platinum substrates. Electro-chemical deposition with Sb present and no chelating agent required a more negative voltage than was needed for the preparation of n-type films. Voltages ranging from −100 mV to −250 mV were found to produce p-type films with the required $Sb_2Te_3$-rich stoichiometry e.g., 60 at % Te). At these voltages, typical current densities were about 1 mA/$cm^2$ and produced film growth rates of about 1 μm/hr. In some situations, the surface morphology was rough and had dendrites.

To work at lower voltages (−25 to −100 mV) and higher deposition rates (5–10 μm/hour), much higher [Sb] concentrations are required to maintain the $Sb_2Te_3$-rich ternary alloy composition. Typical electrolyte concentrations of Bi:Sb:Te are 1.0:32.0:4.0 (in $10^{-3}$M) for such deposition experiments. At those voltages, typical current densities are in the range of up to 6–8 μA/$cm^2$ and produced film growth rates in the range of 5 to 10 μm/hr.

Figure 17:
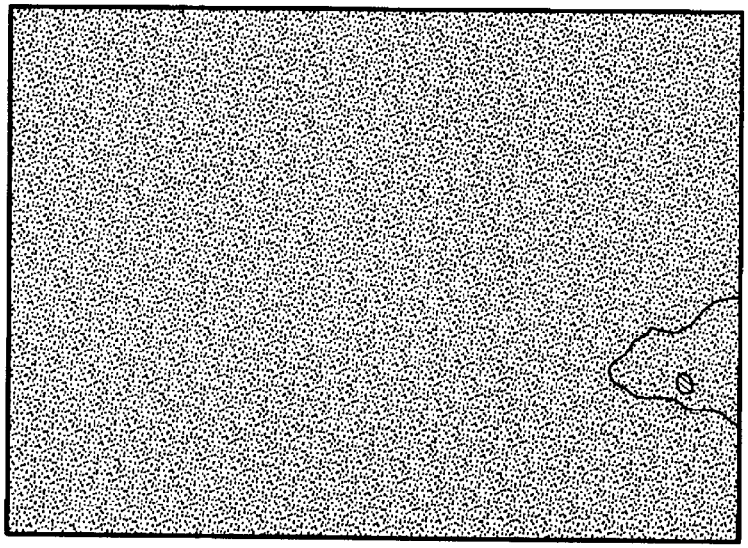
FIG. 17 shows a structure of p-type BiTe alloy.

The micrograph in FIG. 17 shows 20 μm thick $Bi_{12}Sb_{28}Te_{60}$ film grown by this technique.

Te to Bi+Sb Mole Ratio in Solution

One objective is to produce thick $Bi_{2-x}Sb_xTe_3$ films with an atomic ratio similar to optimized bulk grown crystals. This means films of 75 to 90% $Sb_2Te_3$ and 10 to 20% BiTe alloys. Other parameters affect the uniformity and composition of the electrochemical deposition films, but the mole ratio in solution has a significant effect. P-type $Bi_{0.4}Sb_{1.6}Te_3$ thick films were produced with solution concentrations of Bi:Sb:Te of 10 0.18:0.90:1.70 (in $10^{-3}M$) without chelating agent, or 0.2:1.6:0.7 or 1:8:2 with chelating agent.

FIG. 15 shows the atomic Sb/Bi ratio in the deposited BiTe alloy film as a function of the aqueous concentrations of these elements in the electrolyte. Deposition voltage, temperature and Te concentration were identical throughout these experiments. Compositions corresponding to premium bulk alloys were obtained for [Sb]/[Bi]~4.5.

Figure 16:
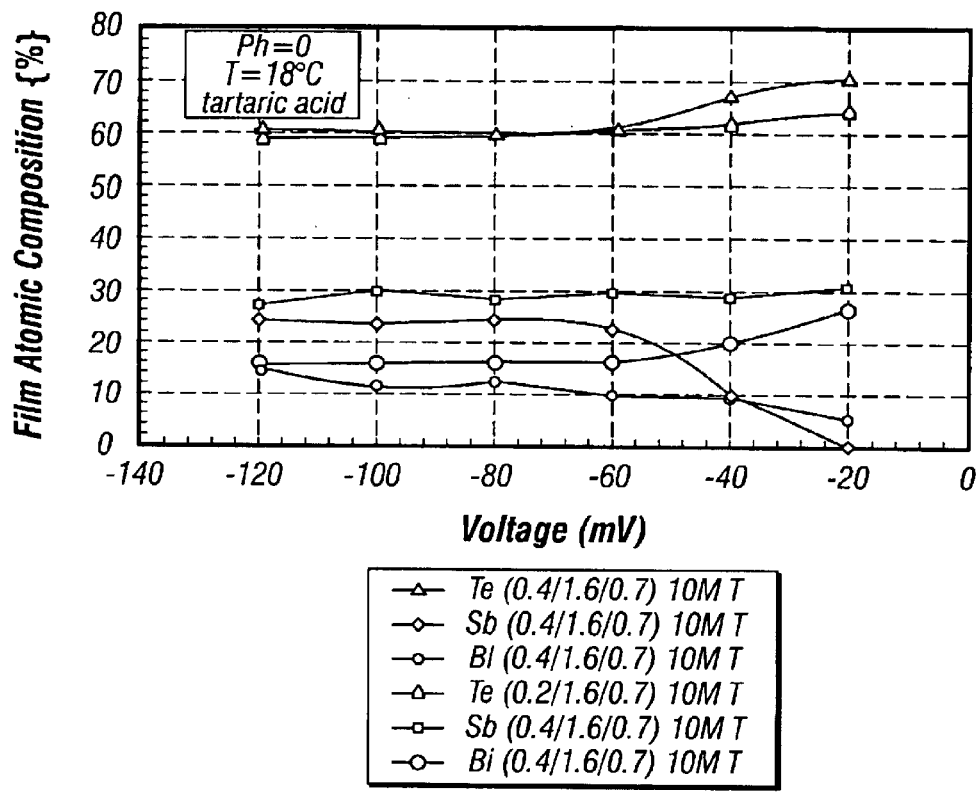
FIG. 16 shows the relationship between the deposition voltage and what is actually deposited.

As shown in FIG. 15, by keeping a constant [Sb]/[Bi] ratio as well as a constant [Te]/[Bi+Sb] ratio, suitable films were produced with concentrations ranging from 0.3 to $0.9 \times 10^{-3}$ M provided that the deposition voltage was maintained in a −100 to −200 mV range (relatively to a standard calomel electrode). When working at lower voltages and higher deposition rates, much higher [Sb] concentrations are required to maintain the $Sb_2Te_3$-rich ternary alloy composition. Suitable electrolyte concentrations of Bi:Sb:Te are 1.0:32.0:4.0 or 0.2:1.6:0.7 (in $10^{-3}M$). This is shown in FIG. 16 using a 10 M concentration of BiTeSb. The introduction of suitable amounts of Se into the electrodeposited film to form quaternary solid solutions can be done by using [Te]/[Se] mole ratio values of 5 to 10.

p-type Characterization of Films

The transport properties of the ternary films have been measured. Some of these films were those deposited on platinum substrates. The measurements confirmed the ternary film's p-type conductivity. In addition, the Seebeck values were shown to be sensitive to the film's stoichiometry.

Measurements of the Seebeck coefficient have been conducted on some of the deposited films. Seebeck coefficient values (measured in a cross-plane direction) as high as 250 $\mu V K^{-1}$ were obtained, depending on the actual composition of the films. The electrical resistivity and thermal conductivity of these films is likely close to that of bulk state-of-the-art thermoelectric BiTe alloys.

Anneal

Suitable heat treatments, up to 300° C. for several hours, may also be used to anneal structural defects introduced during film growth. "High" values of thermal conductivity, as used herein, refers to a level of thermal conductivity sufficient to not pose a significant thermal impedance. This may improve transport properties as in the case of n-type BiTe alloy films grown by electro-chemical deposition. For example, an anneal of 300° C. for 1 hour increased the Seebeck value of one film from 57 to 93 $\mu V/K$.

Since heat treatments are an integral part of the thermoelectric element fabrication process, the role of a stable diffusion barrier is important to prevent rapid degradation from Cu and/or solder contamination of the thermoelectric material.

In all of these processes, a thick photoresist may be used to maintain the geometry of the legs. FIGS. 20A–20D show micrographs of legs grown by the above process of thick photoresist deposition and patterning.

In other embodiments, the hot-wall method may be used to generate the BiTe alloy-based film. This technique is used to deposit films having thicknesses as high as about 30 $\mu$m. Here, the material to be evaporated is placed in a quartz tube located inside a vacuum chamber. A substrate and solid BiTe alloy-based material are placed, respectively, in the top and bottom portions of the tube. The substrate, tube walls, and BiTe alloy-based material are then heated to a temperature which causes the thermoelectric material to evaporate and form on the surface of the substrate. Individual n- and p-doped materials are formed by feeding the appropriate doped material in bulk form in the chamber.

Other thick film growth techniques might include those commonly used in the semiconductor fabrication industry: vacuum evaporation, CVD (chemical vapor deposition) and sputter deposition. While these techniques will probably produce thermoelectric materials with the desired performance, they are best suited to devices with dimensions smaller than a micrometer due to their slower growths (when compared with ECD).

Once appropriate electrochemical depositions of n-type and p-type thermoelectric legs are determined, the next step is to pattern the legs. For these purposes, thick photoresists were developed. For example, in the prior art, photoresists are available but are rated for at most 10 to 20 micrometer thicknesses. X-ray lithography techniques allow thicker growths but are cumbersome and expensive. In the present system, very thick photoresist layers are required, e.g., up to about 60 $\mu$m.

Two types of masks were developed. For the first mask, 10 square shaped patterns were provided. These squares had sizes of 50, 75, and 100 micrometers. A 200 micrometer pitch was provided. After exposing the photoresist, the squares were rounded at the angles. Due to the thickness, these squares were obtained with two successive coatings. Process parameters were optimized to improve the adhesion of the photoresist and the verticality of the wall.

For the second mask, square and circle patterns were provided in sizes of 10, 20, 50, and 100 micrometers. Single and double pitches were provided.

In experiments using the first mask, one aspect noted was that air trapped inside the holes required removal so that the holes could be properly wetted.

Figure 21A:
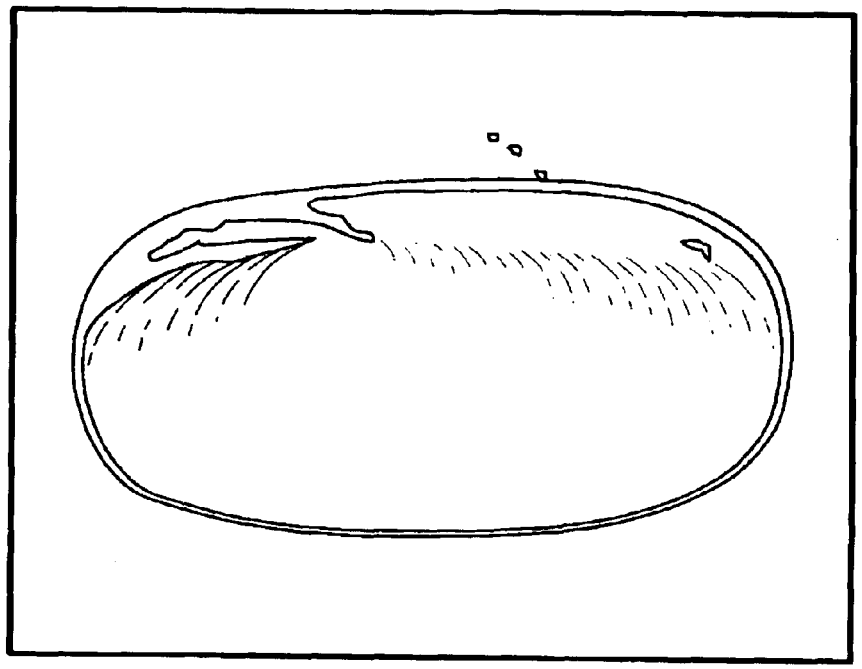
FIGS. 21A & B shows the mushrooming effect.
Figure 21B:
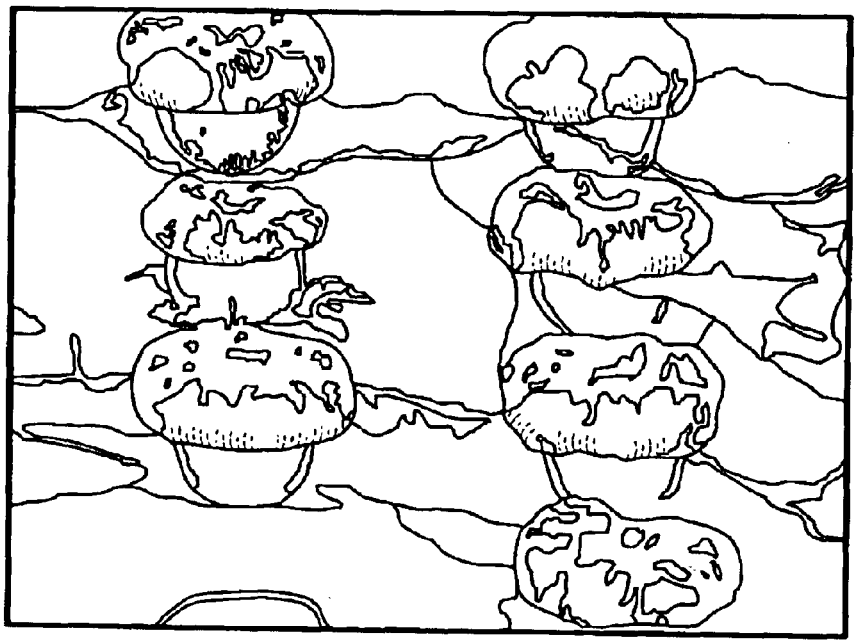

Initial experiments partially cracked and lifted the photoresist. This resulted in muffin-like deposits and star-like legs, as shown in FIGS. 21A & 21B. A solution to this was to begin the process with a few seconds, or up to 1 to 2 minutes, of ultrasonic agitation in deionized water.

Figure 22A:
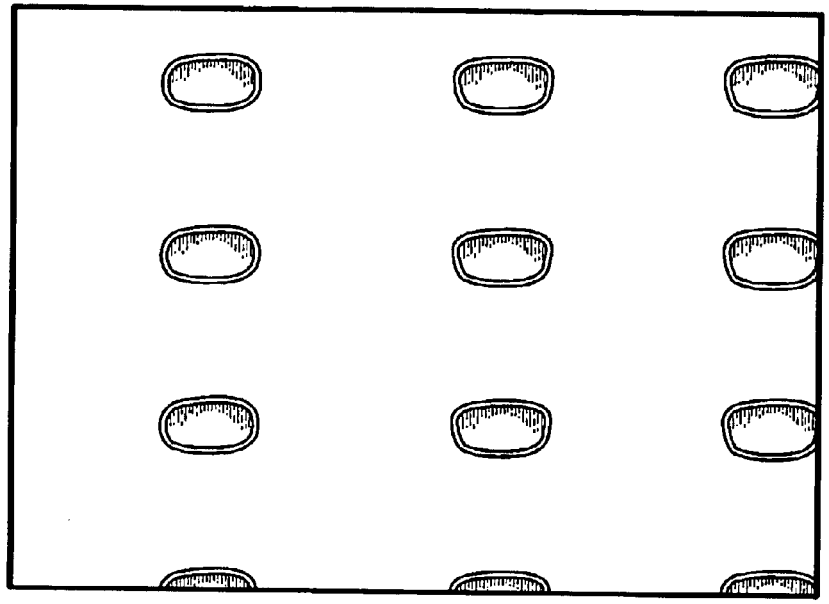
FIGS. 22A–22C show use of electro-chemical deposition to form patterned photoresist layers.
Figure 22B:
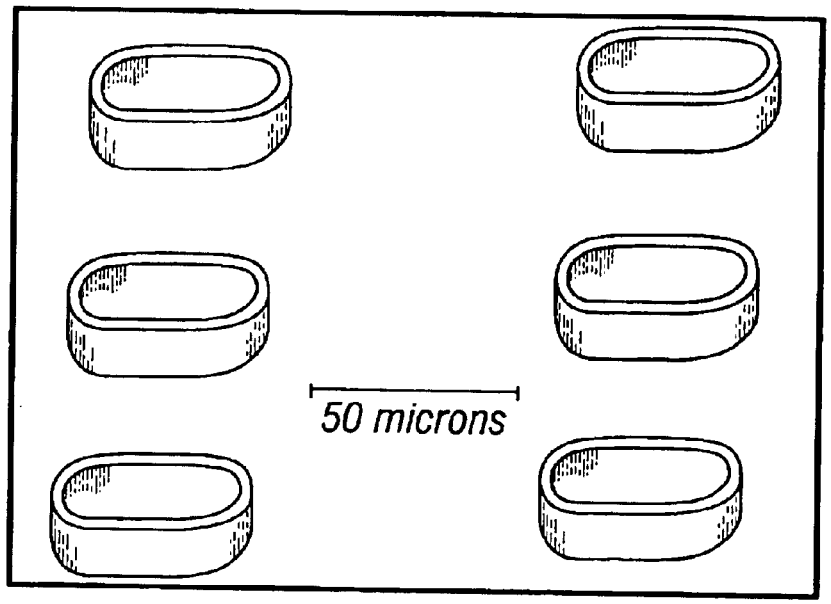
Figure 22C:
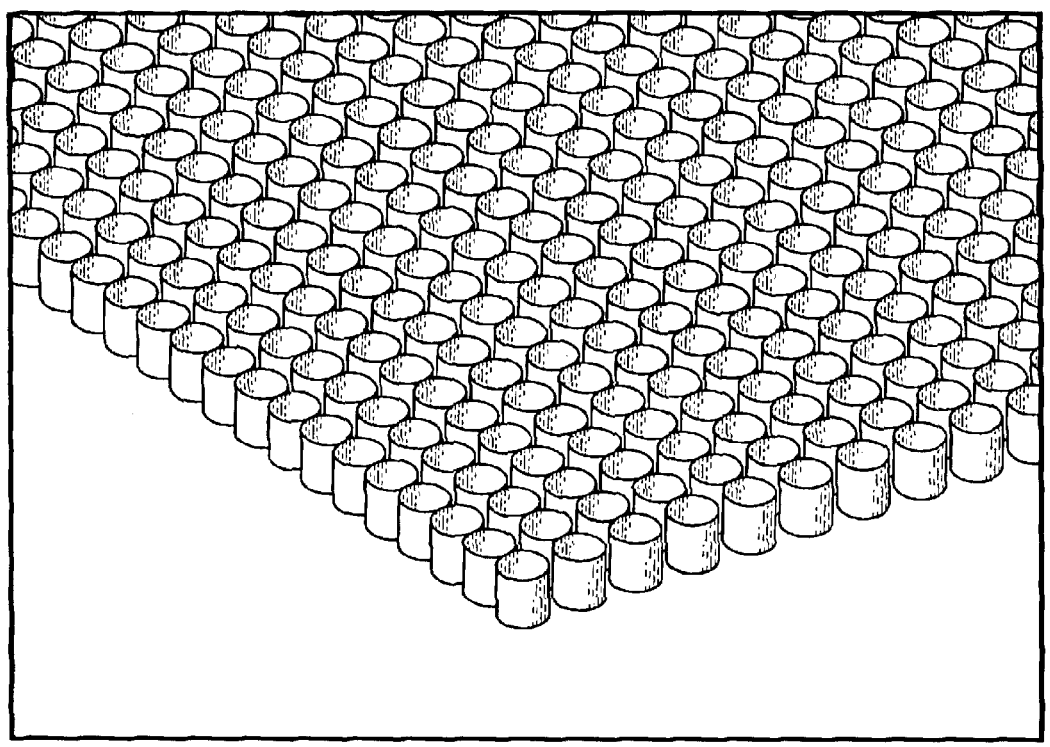

Square legs were also deposited which were 30 micrometers tall and 60 micrometers wide. Experiments showed that the leg growth mushrooms on top of the photoresist layer as soon as the leg becomes taller than the patterned hole. One remedy is to monitor the current intensity as a function of time. Once the leg becomes taller than the hole, the surface area may significantly change, significantly altering the current. By determining when the current intensity changes significantly, the time for deposition may be predetermined. Using this predetermined time, leg deposition can easily be confined to the patterned hole. Using such techniques, the successful growth seen in FIGS. 22A and 22B may be obtained. FIG. 22C shows depositing 11,000 legs in a 3×3 square mm area using this technique.

These legs are preferably columnar, since columnar legs may have more strength per unit size.

Leg growth may also be monitored and assisted by reversing the polarity of the electrochemical deposition voltage once the leg height is at or above the desired height. In this way, a partial removal of materials may be effected with can make the tops of the legs more flat or which can remove mushroom growth. The mechanism for the removal is that the irregularities are preferentially removed as they cause higher electric fields to be produced in their vicinity.

Using the second mask, ultrasonic agitation in deionized water was again performed. This was somewhat more difficult to optimize due to very different pattern sizes. Legs were deposited in both square and round shapes. Characteristic dimensions included a height of 45 micrometers and a width of 20 micrometers. very small spaces were successfully filled by electrochemical deposition. The leg pattern was tightly conformed to the pattern geometry. The legs were confinable to the patterned hole. However, due to the increased pattern sizes after etching, only double pitch patterns in the "10 micrometer" mask could be successfully used (overlapping occurred in single-pitch "10-micrometer" patterns).

An example of the photoresist technique is shown in Table III.

TABLE III

Photolithography:
Resist: Shipley Microdeposit SJR5740

| Coatings: | Coating 1 | Coating 2 |
|---|---|---|
| AZ Adhesion promoter | 30" | — |
| Dry spin | 1000 rpm/20" | — |
| Resist dispense | Syringe (0 rpm) | Syringe (0 rpm) |
| Spinning | 1000 rpm/10" | 2000 rpm / 30" |
| Wait time | 5' | 5' |
| Ramp | 200° Ch$^{-4}$ (RT-105° C.) | — |
| Soft bake | 5'/105° C. | 5'/105° C. |
| Thickness | 24 $\mu$m | 18 $\mu$m |
| Exposure: | 130"/-8W cm$^{-2}$/405 nm | |
| Develop: | 6–10°/Clariant AZ 421K (1:1) | |

Figure 23A:
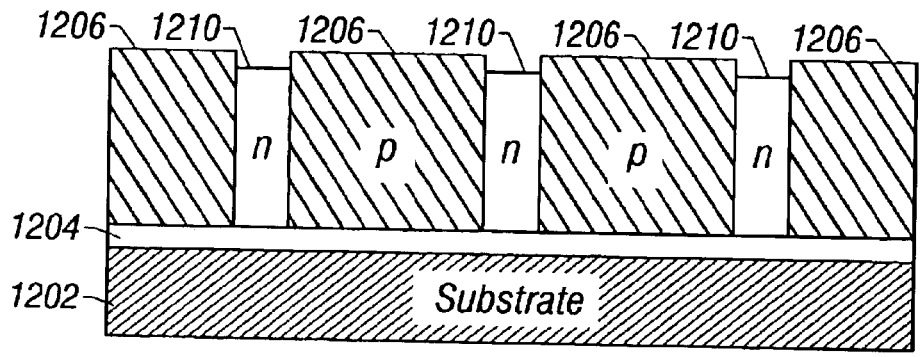
FIGS. 23A–23H show a first formation technique according to the present system.

FIGS. 23A–H show an embodiment of the fabrication method. A substrate 1202 is shown with a metallization layer 1204. A photoresist 1206 is shown in several blocks. Photoresist 1206 is initially laid down in known manner and is patterned and etched to leave interstices where the n-type legs are to be deposited. As seen in FIG. 23A, this figure shows the n-type legs already having been deposited.

Figure 23B:
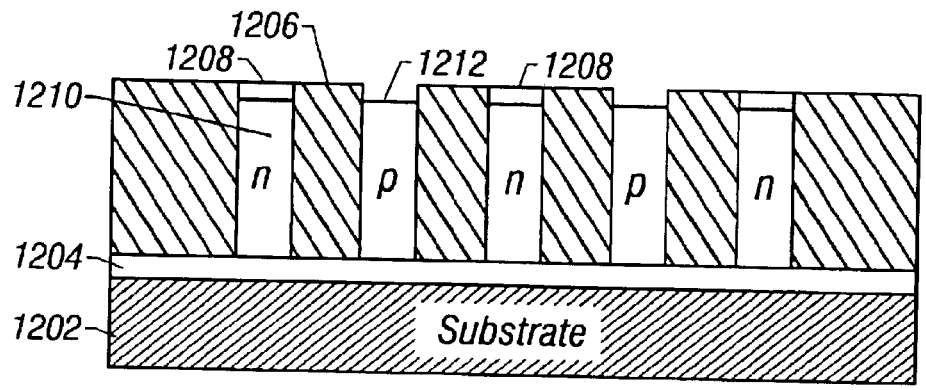

Referring to FIG. 23B, the photoresist layer is masked with additional photoresist 1208 to cover the n-type legs 1210. The photomask is shifted using an aligner and is patterned in such a way as to allow etching at interstices where p-type legs are to be deposited by electrochemical deposition. Following this shifting and etching, p-type legs are deposited in the manner described above. These p-type legs are referred to as elements 1212 in FIG. 23B. Thus, two exposures of the same photoresist are performed. In such procedures, it is difficult to perform the second step as the photoresist has already been hardened once. It may be preferable to use yellow light as the illuminating light in the first exposure step to prohibit complete hardening of the photoresist.

Figure 23C:
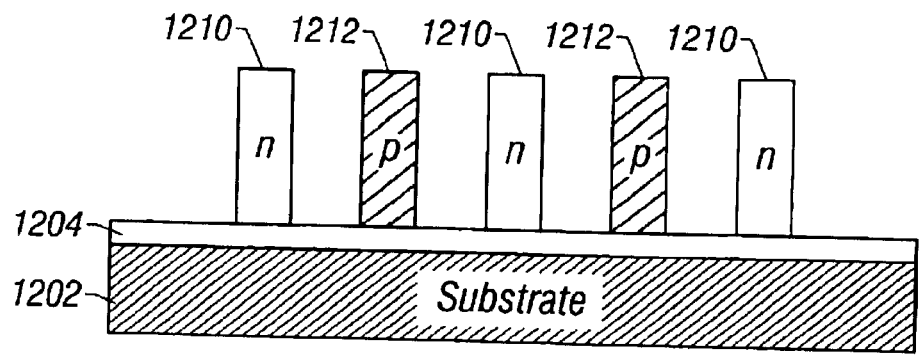
Figure 23D:
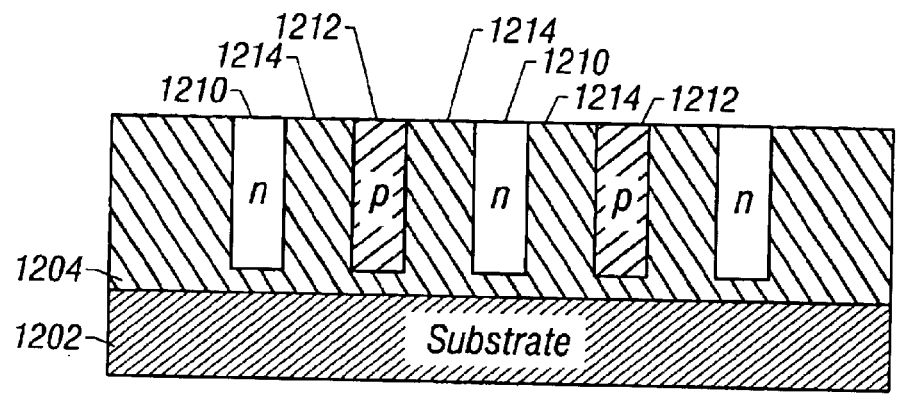

FIG. 23C shows all of the photoresist dissolved, leaving substrate 1202, metallization layer 1204, n-legs 1210, and p-legs 1212. Referring to FIG. 23D, an underfill material 1214 is provided between the legs. The underfill material was originally developed for flip chip technology. The underfill material 1214 generally requires curing (such as at least about 150° C. for 30 minutes). The underfill material 1214 allows for further processing without loss of mechanical integrity. For example, chemical-mechanical polishing may be required and may be provided with the strengthened legs.

Figure 23E:
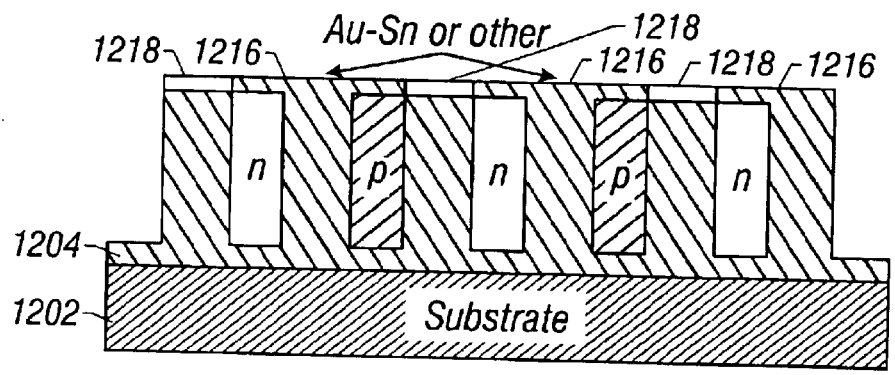

Referring to FIG. 23E, a diffusion barrier is then deposited on top of the legs and underfill material. At this point, electrode material 1216 may be deposited to connect the n-type material with the p-type material in appropriate locations. The electrode material may be made of gold, tin, or other similarly conductive materials. The photomask is used to allow deposition of electrodes 1216 in desired locations. This photomask is shown in FIG. 23E as mask 1218.

Figure 23F:
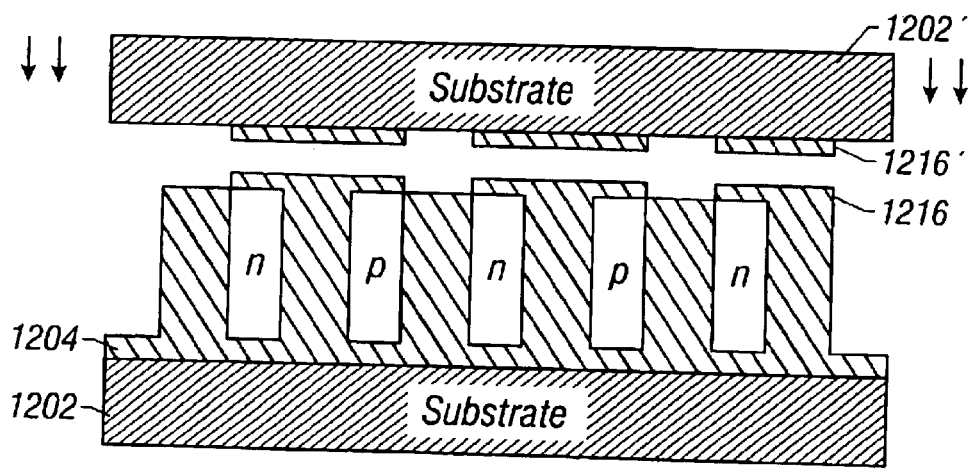

Referring to FIG. 23F, a substrate 1202' is shown with similar electrode layers 1216' as are located in FIG. 23E. Substrate 1202' may be bonded to substrate 1202 and its accompanying leg structure by disposing electrodes 1216 opposite electrodes 1216'. Bonding may be accomplished using a bonder-aligner with a brief heat treatment. The precision of bonding should be on the order of 5 micrometers. The heat treatment could be for, e.g., three minutes to 300° C., and 7 minutes down to 100° C.

Figure 23G:
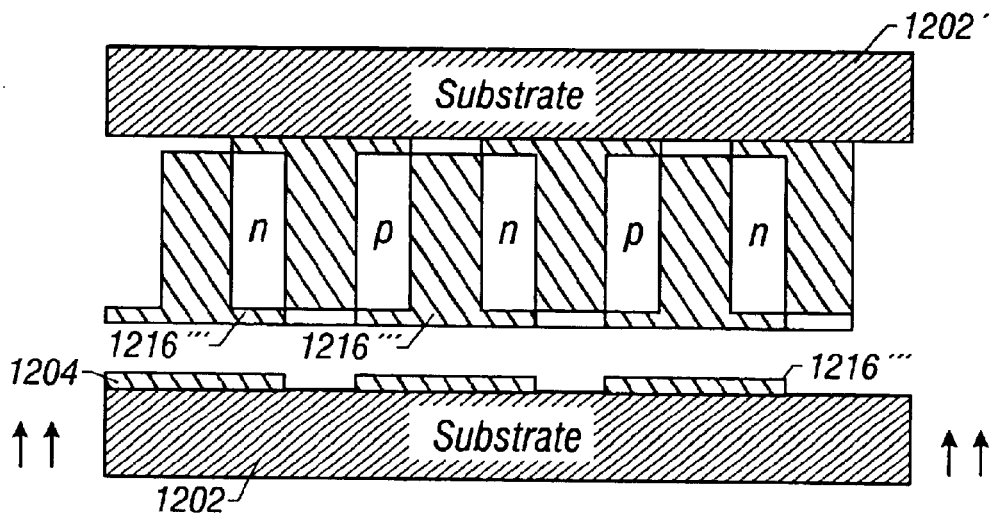

Referring to FIG. 23G, the growth substrate 1202 may then be removed. A new photomask may be applied and electrodes 1216''' may be applied on the lower surface of the leg structure. A substrate 1202", similar in structure to substrate 1202', may then be attached to the bottom side of the leg structure by disposing electrodes 1216" opposite electrodes 1216'''. In this manner, the appropriate electrical connections may be made for all of the thermoelectric legs.

Figure 23H:
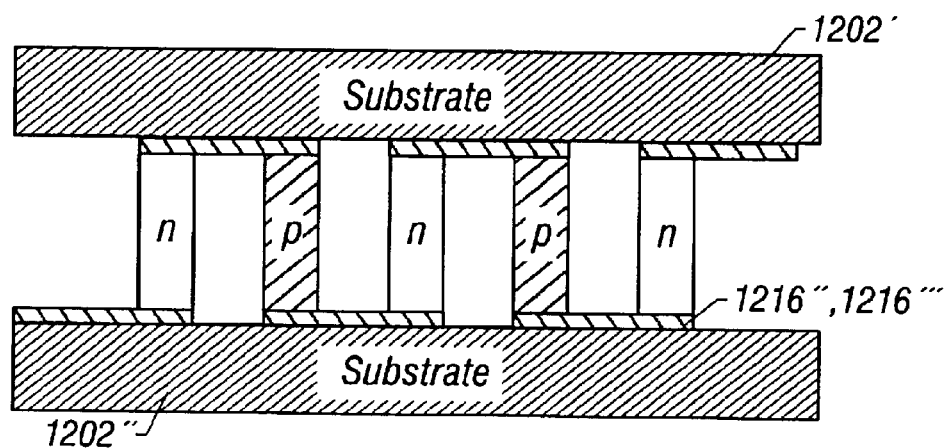

The structure may be used as shown in FIG. 23G, in which the underfill is retained in order to allow a very high ruggedness for the device. Alternatively, for appropriate applications, the underfill material may be removed, as shown in FIG. 23H.

Figure 24:
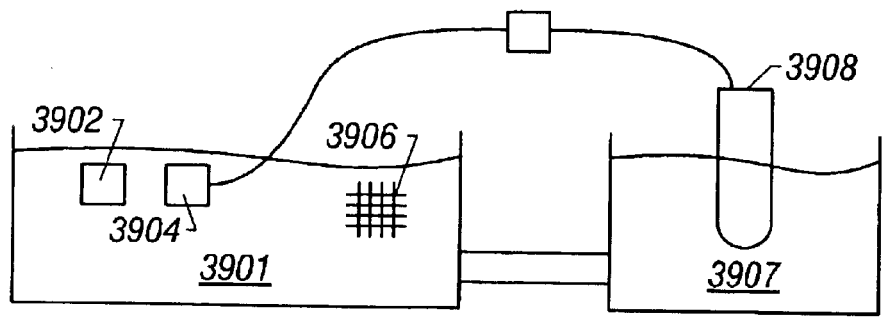
FIGS. 24 and 25 show an interdigitated technique.
Figure 25:
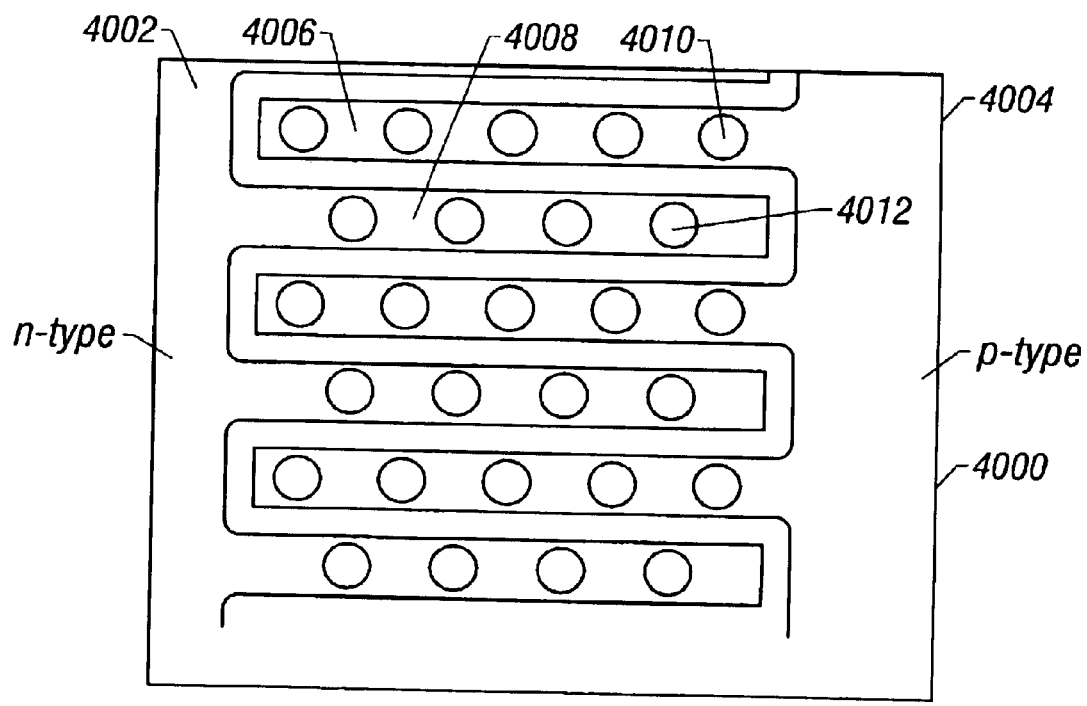
Figure 26:
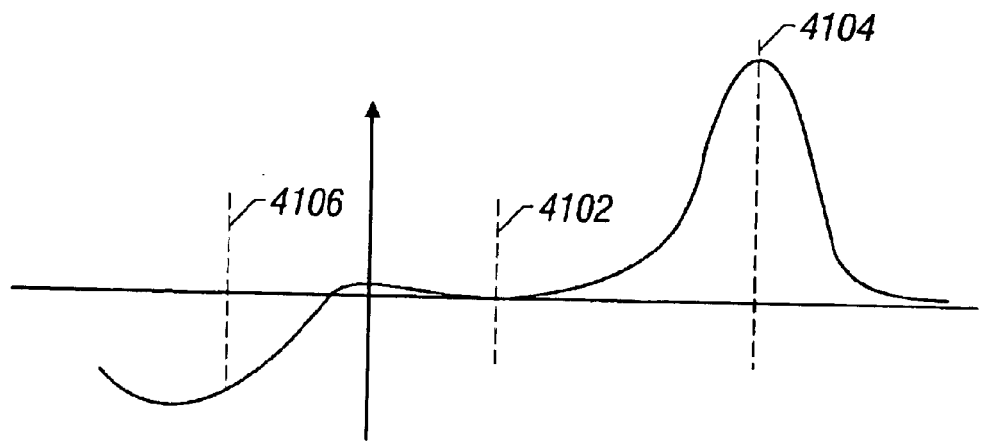
FIG. 26 shows properties of the interdigitated technique.

FIGS. 24–26 show another embodiment of a growth method, termed a "bipotentistat" method. Using this technique, legs of both doping types may be grown without the need to cover legs of one type with a cover layer as is necessary in the embodiment of FIGS. 23A–23H.

FIG. 24 shows two working electrodes 3902 and 3904 are disposed in a first bath 3901, which may be NHO$_3$. The substrate may be placed on one of the working electrodes as dictated by the requirements of the process. A mesh counter-electrode 3906 is also disposed in the bath 3901.

Reference electrode 3908 is in a second bath 3907 which is in fluid connection with the first bath.

Referring to FIG. 25, substrate 4000 is patterned such that interleaving fingers 4006 and 4008 are connected to electrodes 4002 and 4004, respectively. In this figure, metallization fingers 4006 will be the base for growth of the p-type legs 4010, and metallization fingers 4008 will be the base for growth of the n-type legs 4012.

The substrate 4000 is patterned such that holes are left for growth of legs 4010 and 4012. However, each growth can occur successively without the need to cover the previously grown legs. This is a significant manufacturing advantage over the first growth embodiment described above at least because it avoids the problem of double exposure of the photoresist.

Growth of the n-type or p-type legs may be selectively chosen, and growth of the other prohibited, by a careful choice of voltages for each of the electrodes. FIG. 26 shows a voltammogram of a general system. Growth of, e.g., n-type or p-type legs may occur at point 4106. No growth occurs at point 4102 and removal of the deposited film occurs at 4104. These are exemplary and depend on the system. In general, growth of an n-type or p-type leg may occur at point 4106 in the graph, and no growth occurs at 4102. Thus, the bipotentistat may be set up with appropriate voltages such that growth occurs for the n-type but not for any other growth, e.g., one of the voltages is at point 4104 and the other is at 4102. The bath and voltage may then be changed so that growth occurs for the p-type but not for any other growth.

Variations of the this bipotentistat technique may also be used. This can be done in two different ways:

1) only one bath, but two voltages results in two different compositions, one n-type the other p-type. This can be done with the bipotentiostat since it can control independently two separate electrodeposition voltage values (on the same substrate, provided that two separate electrodes—one for n, one for p—are patterned on it), or 2) two baths but same configuration: in sequence, first bath, electrode 1 for n-type, electrode 2 at voltage so that no deposition takes place (zero current); then second bath, electrode 1 at zero current, electrode 2 for p-type.

Additional formation embodiments are shown in FIG. 27. FIG. 27A shows the first step of the process. A substrate 2700 of silicon/$SiO_2$ is first formed. This is formed with a thin conductor, approximately 0.5 $\mu$m thick, of etchable conductive material 2702. The preferred material, for example, is TiAl. Copper pads 2704 and 2706 are formed on the thin conductor 2702 and are each covered with a diffusion barrier 2708, 2710 of a type previously discussed.

Figure 27A:
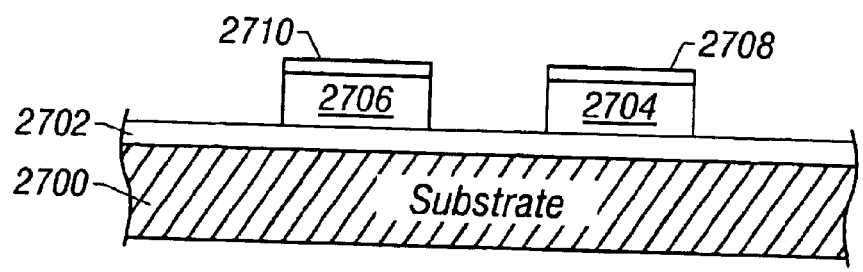
FIGS. 27A–27D show a simplified formation technique similar to that shown in FIG. 23.
Figure 27B:
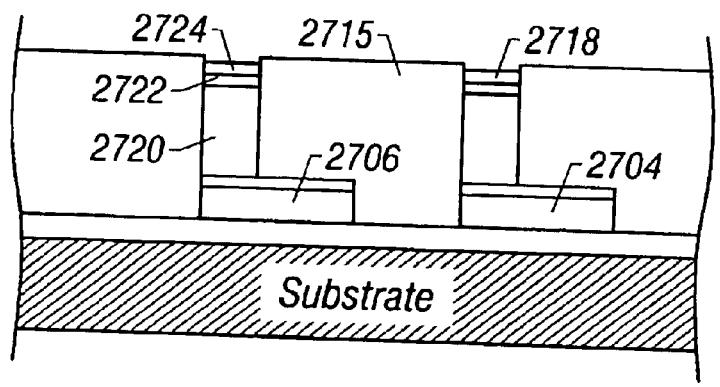

In FIG. 27B, a photoresist 2715 is formed which has first hole areas 2718. Each of these hole areas 2718 will be filled with an n-type material 2720. Note that the n-type material is formed to one side of each of the copper pads 2706, 2704, i.e., not centered over the pad. The n-type material is covered with a Ni diffusion barrier 2722 and a solder layer 2724 which is BiSn or PdSn. All of this can be done by electrochemical deposition.

Figure 27C:
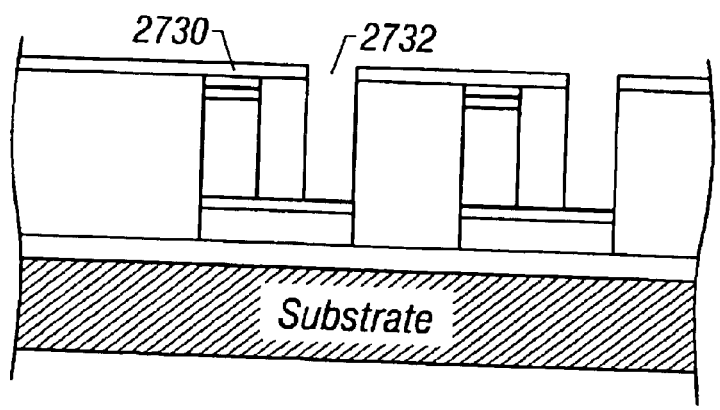

FIG. 27C shows the next step of adding another, thin, photoresist layer 2730, and opening second holes 2732 which will be used for the p-type material. This is preferably done under yellow light. The thin layer of photoresist 2730 covers the n-type material 2720. The layers of p-type material, and corresponding solder layers, are formed in those holes.

Figure 27D:
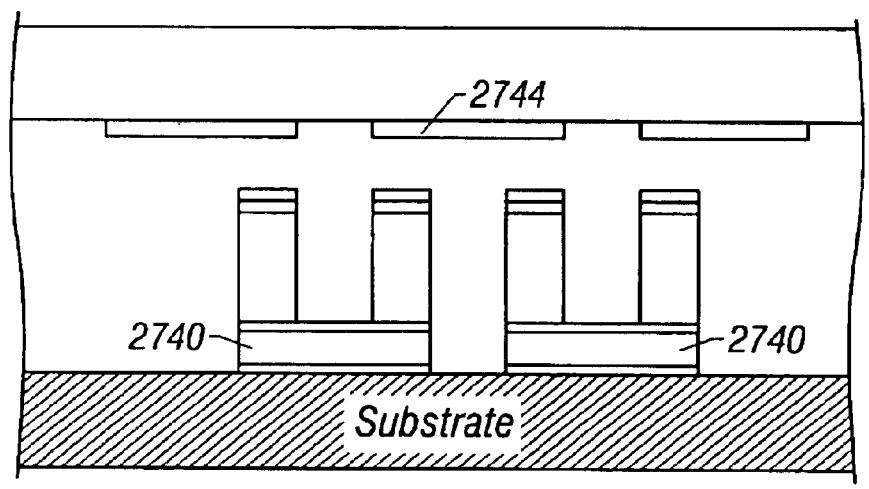

FIG. 27D shows dissolving the photoresist 2715, 2730, and the metallization between the resultant legs in the area 2740 to avoid a short circuit between all of the legs. This is done using an acid etch, for example. A top substrate 2742 is added to form interconnections 2744 between the adjacent n- and p-layers.

Figure 28A:
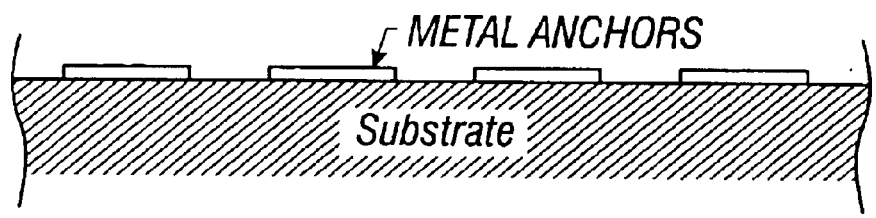
FIGS. 28A–28L show the formation sequence for the interdigitated technique.
Figure 28B:
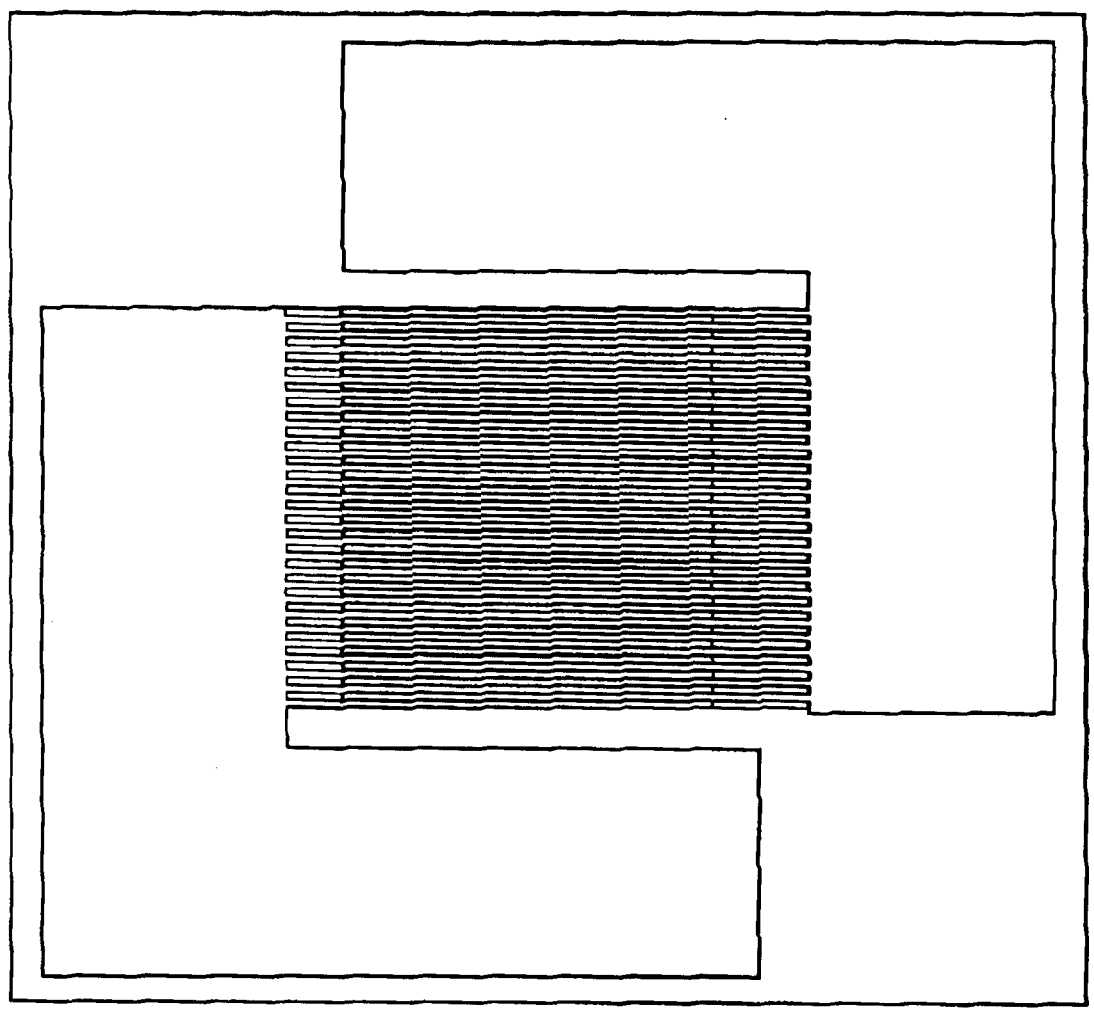
Figure 28C:
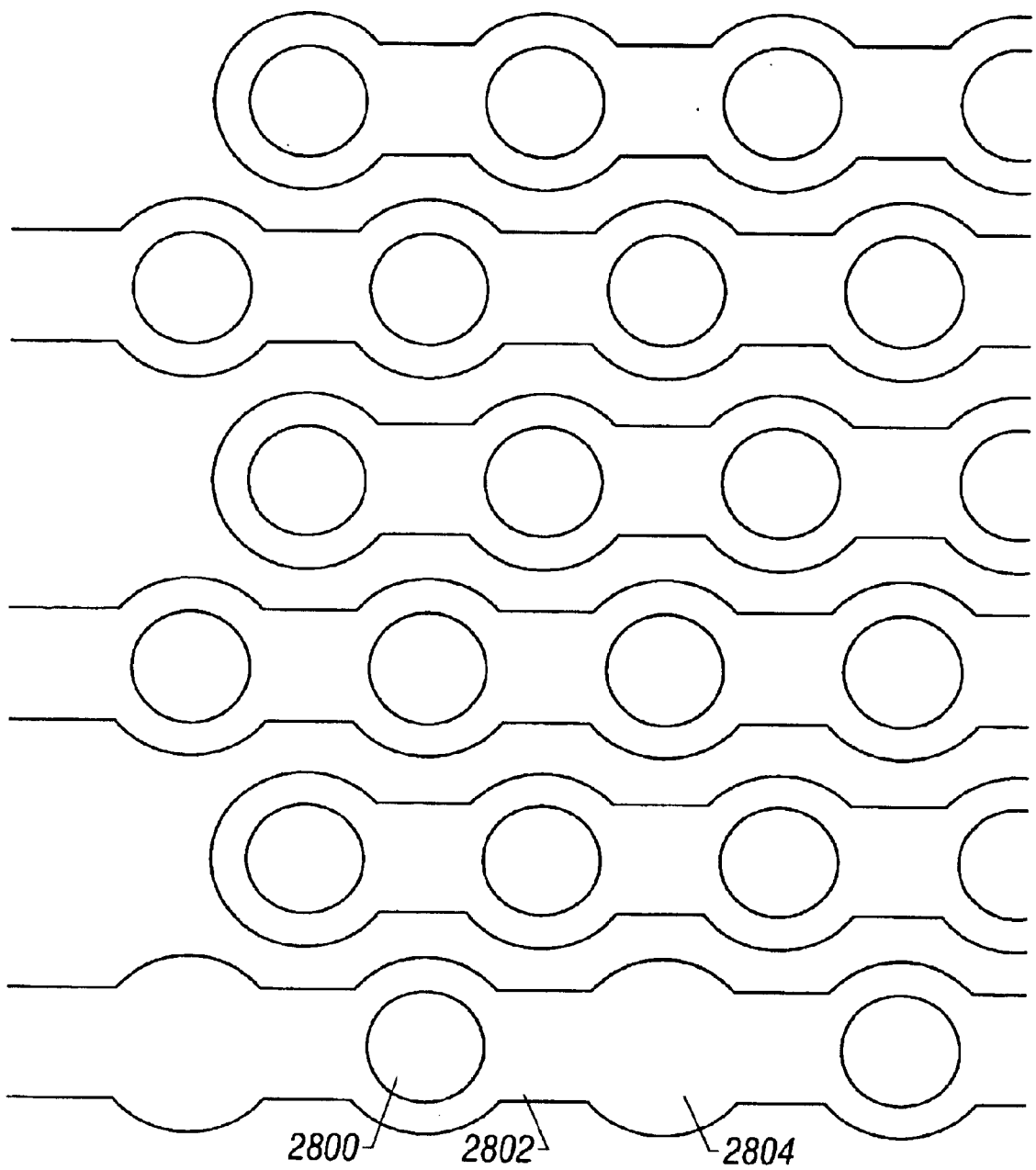

An alternative formation technique, which we call an interdigitated technique, is described with reference to FIG. 28. This begins by forming a substrate with metal "fingers." The substrate is shown in cross-section in FIG. 28A, and is shown from above in FIG. 28B. Further detail blow-up of the fingers is shown in FIG. 28C. As can be seen from this figure, each of the fingers is formed with increased size rounded parts on each finger 2800. According to this technique, one of the legs will be formed at each round part 2802, 2804.

Figure 28D:
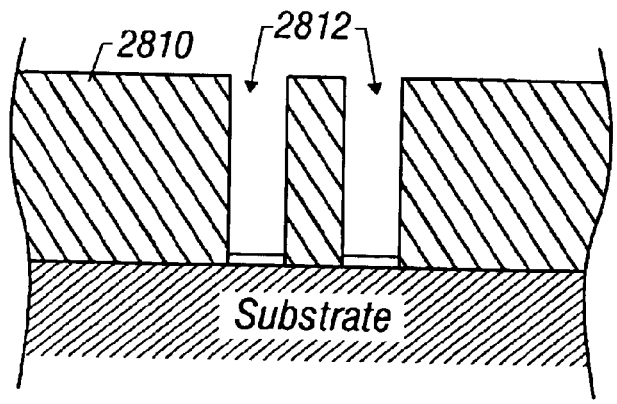
Figure 28E:
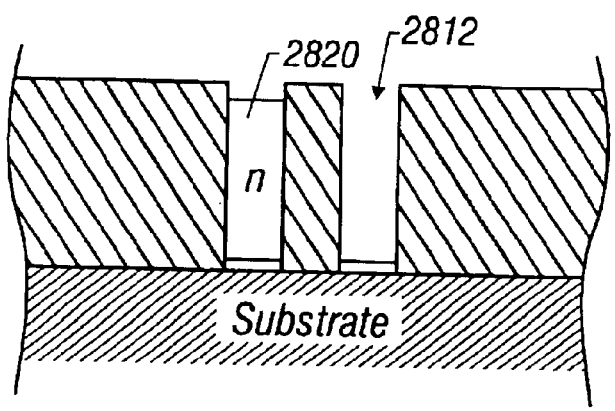

The process carries on using the techniques shown in FIG. 28D. First, as in the above technique, a photoresist 2810 with holes 2812 is added. The first hole over a first portion of the finger is filled with n-type material 2820 as shown in FIG. 28E. This is done in an n-type electrolyte where the p-type fingers are biased positive to prevent deposition.

Figure 28F:
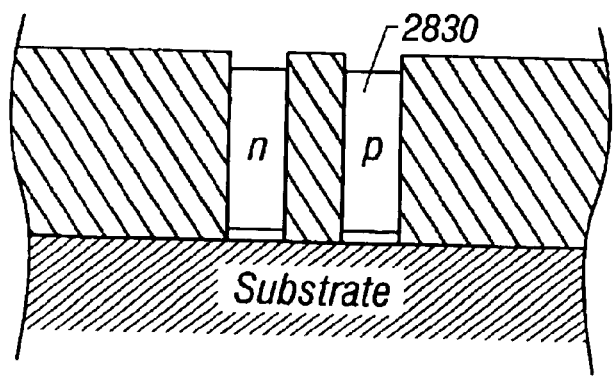

Subsequently, as shown in FIG. 28F, the p-type ECD is carried out in a p-type electrolyte to form p-type material 2830. During this time, the n-type electrodes are biased positive in order to prevent their deposition. This results in n- and p-legs which are adjacent to one another.

Figure 28G:
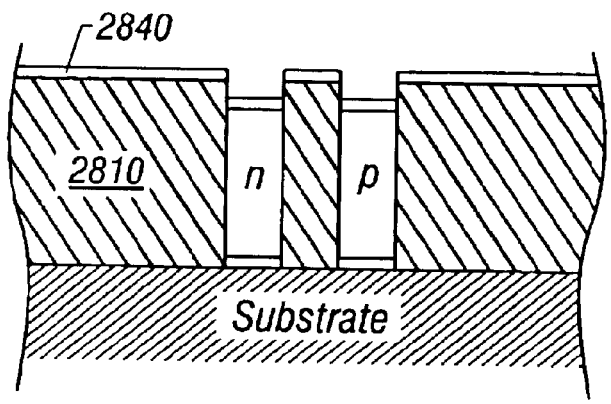

FIG. 28G shows depositing a thin layer of metallization 2840 to the tops of the n- and p-legs. This also has an undesired effect of adding excess metallization on top of the photoresist 2810.

Figure 28H:
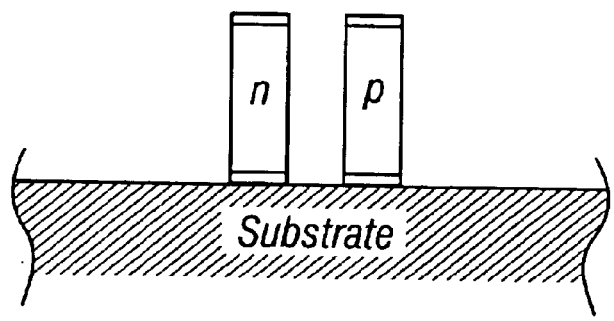

In FIG. 28H, the photoresist is removed by conventional techniques, e.g., dipping the entire substrate into acetone.

Figure 28I:
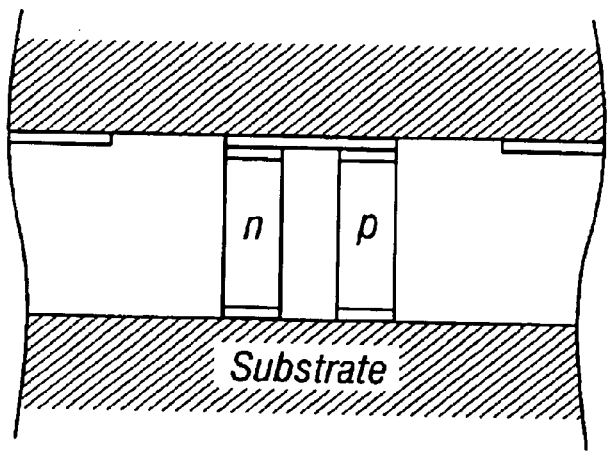
Figure 28J:
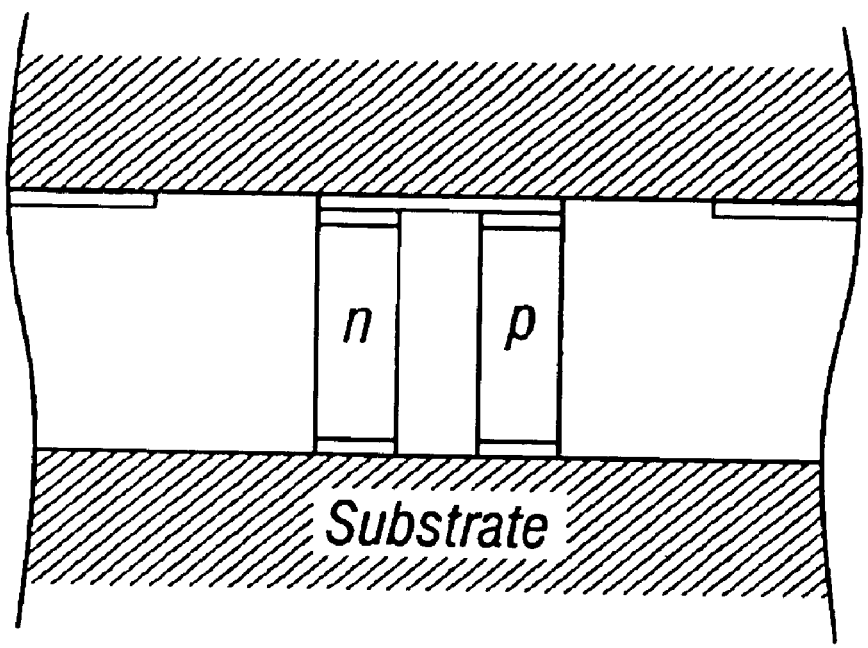
Figure 28K:
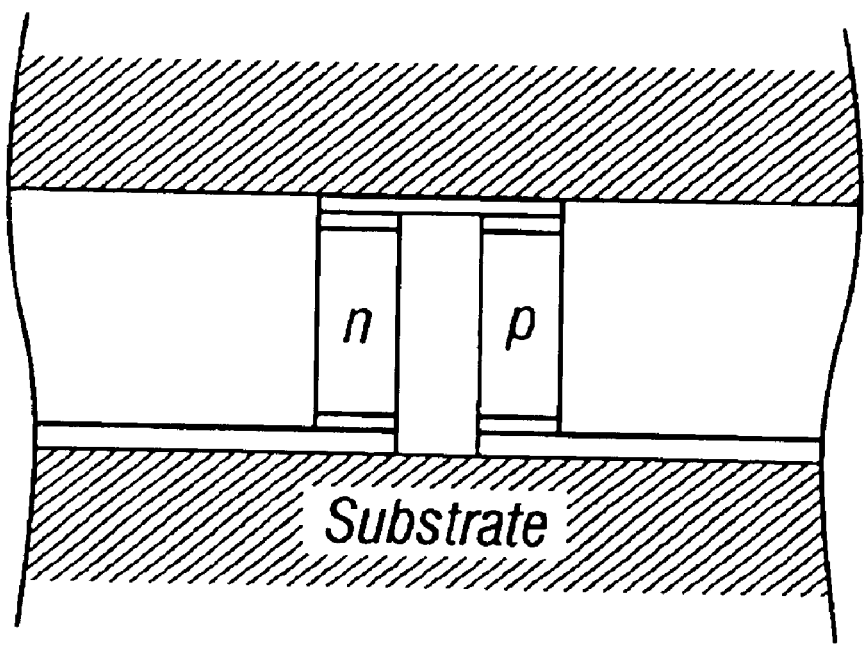
Figure 28L:
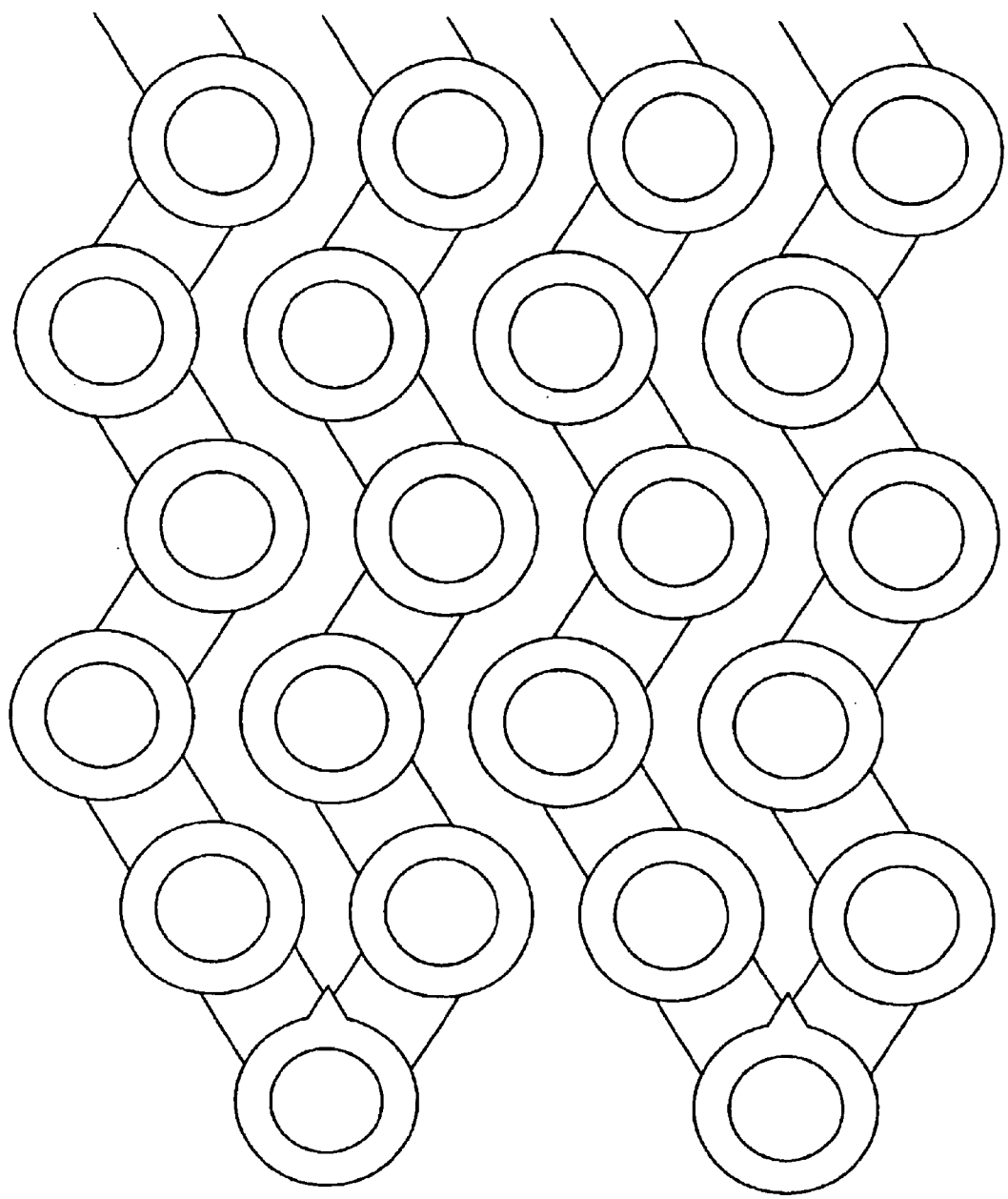

A top substrate is then attached as shown in FIG. 28I. At this time, the bottom substrate is removed to remove the otherwise short circuit that would exist between all the legs. A new bottom substrate is interconnected as shown in FIG. 28J, which includes new bus portions bonded to the legs as shown in FIG. 28K. The interconnection can be, for example, as shown in FIG. 28L.

In summary, a thermoelectric device has been developed which may advantageously be employed for powering small consumer electronics such as watches. N-type legs of significant thickness are deposited using materials such as BiTe alloys. Such legs may be deposited at high deposition rates, meaning that only two to three hours may be needed for 40 micrometer-thick legs. Changes in stoichiometry and surface morphology are well understood. P-type layers of $(Bi_{1-x}Sb_x)_2Te_3$ layers have also been deposited using increased Sb solubility achieved by using tartaric acid. This has resulted in a vast improvement in deposition rate and surface morphology, resulting in less sponge-like deposits.

Diamond substrates (100 $\mu$m to 1 mm thick) can be obtained from a number of commercially available sources (e.g., Norton, Diamonex, Crystalline Materials, and General Electric). Materials other than diamond which may be used include: high purity silicon, aluminum nitride, or materials with similar properties available from, e.g. Carborundum, Inc.

The performance of the device depends on the size of the thermoelectric legs, the number of legs, the temperature difference across the legs, the electrical contact resistance between these legs and the upper and lower stack structures, and the thermal resistance between the heat-dissipating device and the substrate.

A useful amount of electrical power for a thermoelectric device to produce to power an electronic device may be on the order of several tens to hundreds of microwatts at one volt in low ΔT environments.

EXAMPLE

A wristwatch application is described as an example. It should be noted that any electronic device with similar power requirements may be powered similarly, as long as a thermal gradient is present.

ΔT may be as low as 1° C. for a wristwatch application. This low ΔT is assumed as an operating point due to uncertainty in the ambient environment and the efficiency of heat rejection. A desirable size for the thermoelectric device module may be in the range of about 1.5 mm×1.5 mm in such an application.

A basic heat collection area of 100 mm² is considered (e.g., 10 mm×10 mm) for purposes of this discussion. Heat rejection occurs from the outer edge of the watch front, or the face (the center is typically glass). Thus, it may be desirable for the thermoelectric device to be positioned around the circumference of the watch interior, drawing heat from the solid back, and rejecting heat to the periphery of the front side.

A thermal analysis of one potential watch configuration has been performed. This analysis identifies the design operating temperature and a thermal resistance budget for the thermoelectric device. One complication for the analysis is a large variation in the ambient environment for heat rejection (i.e., the air temperature and humidity) and the type of clothing being worn. An additional variable is the amount of time a watch is worn each day. Thermal and structural models may be used to determine the optimum configuration of the device under various operating conditions. Considerations include the thermal resistance, heat spreading, and the leg configuration. Considerations for mechanical stress should further include device failure due to thermal cycling.

One possible design temperature differential identified by the analysis is 1° C. Using a figure of merit of 200 μV/° C. per BiTe leg, the thermoelectric device power source would require 5000 legs for the design temperature differential of 1° C. to produce the one volt (open circuit) required to run the watch.

The thermal resistance budget depends on the conduction paths for the heat flow from a watch back to a front surface. These include thermoelectric device elements $\theta_{TEG}$, air resistance within the watch $\theta_a$, skin contact resistance $\theta_s$, a heat transfer resistance to the ambient air $\theta_o$, a heat conduction resistance of other internal watch parts $\theta_p$, and a contact resistance with the thermoelectric device $\theta_c$.

As is known, resistance [K/W] is inversely proportional to conductance [W/K], and conductance equals conductivity times area divided by length [W/m-K]:

$$\theta = \frac{1}{\lambda} = \frac{L}{\lambda_0 s}$$

For the watch, $$\theta = \theta_0 + \left( \frac{1}{\theta_p} + \frac{1}{\theta_a} + \frac{1}{\theta_c + \theta_{TEG}} \right)^{-1} + \theta_s$$

FIG. 4 shows a detail of the circumferential configuration of a watch body, which represents the major contribution to parallel heat flow. This configuration has a height h, a radial width w, and a radius (to the center of width w) of r. E.g., h may be about 4 mm, r about 20 mm, and w about 3 mm. Assuming a plastic body, $\lambda_{plastic}$ is about 0.2 W/m-K, and $\theta_p$ is about 50 K/W. In this analysis, values of $\theta_a$ of about 100 K/W and $\lambda_{Bi-Te}$ of about 1.5 W/m-K were also used. In the case of $\lambda_{Bi-Te}$, a $\theta_{TEG}$ of about 50 K/W was obtained.

From this analysis, a thermal resistance budget for the thermoelectric device element was established at a value of 50 K/W (equivalently, 50° C./W). This thermal resistance budget can be used to evaluate candidate thermoelectric device configurations which produce the required voltage and power and have an acceptably high thermal resistance.

Although only a few embodiments have been described in detail above, those having ordinary skill in the art will certainly understand that many modifications are possible in the preferred embodiment without departing from the teachings thereof. All such modifications are intended to be encompassed within the following claims. E.g., other materials can be substituted for the BiTe alloy-based material to achieve different performances and temperature ranges. Some suitable materials exhibit a ZT value greater than 1, where ZT is a figure of merit defined as:

$$ZT = \frac{ST^2}{(\rho \cdot k)}$$

where S is the material's Seebeck coefficient, ρ is the electrical resistivity, and k is the thermal conductivity. In general, however, this depends on the application. For example, such a criterion may not be applicable for waste heat recovery systems, etc.

In other embodiments, each of the materials listed in Table I may be replaced with another material having suitable electronic, thermal, and mechanical properties and substituted into the power-generating device. The structures of the upper and lower stack structures can also be modified.

High-thermal conductivity materials, such as silicon carbide, or related materials, such as aluminum nitride, boron nitride, or beryllium oxide have properties close to those for diamond. In general, these materials are electrical insulators, have high thermal conductivities, and are durable. Other materials having desirable thermal, mechanical, and electrical properties, such as ceramics or polymers, may also be used.

Thermoelectric BiTe alloy-based alloys can also be deposited as a film using the flash-evaporation method. In this technique, the BiTe alloy-based material, in the form of fine grains, is fed into a high-temperature heating chamber.

The chamber is then evacuated and heated to the desired temperature. N-type BiTe alloys can be grown by introducing an additional chalcogen source, such as tellurium or selenium, into the heating chamber. The stoichiometric amount of chalcogen can be varied by adjusting the temperature (and thus the vapor pressure) of the source material. Similarly, p-doped films can be grown by introducing additional bismuth, antimony, or tellurium to the source material, and by adjusting the temperature accordingly. Films having thicknesses on the order of a 10–20 μm can be formed with this method.

The techniques can also be used to form nanowires by using electro-deposition for filling porous templates with nanotube structures. Low dimensionality thermoelectric materials will likely have better performance due to quantum effects and interface transport effects for electrical and thermal transport parameters.

Still other embodiments are within the scope of the following claims.

What is claimed is:

1. A thermoelectric device, comprising:
    a plurality of n-type thermoelectric devices, having first and second ends with a temperature gradient thereacross;
    a plurality of p-type thermoelectric devices, also having first and second ends with the same temperature gradient thereacross;
    each of said n- and p-type thermoelectric legs being 40 μm in thickness or less;
    a first series connection between a first end of said first n-type device and said first end of said first p-type device and a second series connection between said second end of said first p-type device, and a second end of a second n-type device, to thereby place at least a plurality of p- and n-type devices in series with one another, maintaining a thermal parallel relationship.

2. A device as in claim 1 wherein said connections are connected by a solder bump.

3. A device as in claim 1 wherein there are more than 1000 of said legs.

4. A device as in claim 1 wherein there are more than 10,000 of said legs.

5. A device as in claim 1 further comprising a first diffusion barrier at said first end of each of said n-type devices and said p-type devices, and a second diffusion barrier at a second end of each of said n-type device and p-type device.

* * * * *

UNITED STATES PATENT AND TRADEMARK OFFICE
CERTIFICATE OF CORRECTION

PATENT NO.     : 6,787,691 B2
DATED          : September 7, 2004
INVENTOR(S)    : Jean-Pierre Fleurial et al.

It is certified that error appears in the above-identified patent and that said Letters Patent is hereby corrected as shown below:

Title page,
Item [63], Related U.S. Application Data, should read as follows:
-- [63]  Continuation of application NO. 09/198,069, filed on Nov. 23, 1998, now Pat. No. 6,388,185. --

Signed and Sealed this

Fifth Day of April, 2005

JON W. DUDAS
*Director of the United States Patent and Trademark Office*